(12) United States Patent
Chen et al.

(10) Patent No.: US 11,486,722 B2
(45) Date of Patent: *Nov. 1, 2022

(54) VEHICULAR EDGE SERVER SWITCHING MECHANISM BASED ON HISTORICAL DATA AND DIGITAL TWIN SIMULATIONS

(71) Applicant: Toyota Motor Engineering & Manufacturing North America, Inc., Plano, TX (US)

(72) Inventors: Dawei Chen, Mountain View, CA (US); BaekGyu Kim, Mountain View, CA (US); Roger Melen, Mountain View, CA (US)

( * ) Notice: Subject to any disclaimer, the term of this patent is extended or adjusted under 35 U.S.C. 154(b) by 363 days.

This patent is subject to a terminal disclaimer.

(21) Appl. No.: 16/854,736

(22) Filed: Apr. 21, 2020

(65) Prior Publication Data
US 2021/0325198 A1 Oct. 21, 2021

(51) Int. Cl.
*G01C 21/34* (2006.01)
*H04W 4/44* (2018.01)
*G05D 1/00* (2006.01)

(52) U.S. Cl.
CPC ....... *G01C 21/3492* (2013.01); *G05D 1/0022* (2013.01); *G05D 1/0027* (2013.01); *H04W 4/44* (2018.02)

(58) Field of Classification Search
CPC ........ G01C 21/00; G01C 21/26; G01C 21/34; G01C 21/3453; G01C 21/3492; G05D 1/00; G05D 1/0011; G05D 1/0022; G05D 1/0027; G05D 1/02; G05D 1/021; G05D 1/0287; G05D 1/0291; G05D 1/0297; G05D 2201/00; G05D 2201/02; G05D 2201/0213; G06F 30/00; G06F 30/10; G06F 30/15;
(Continued)

(56) References Cited

U.S. PATENT DOCUMENTS 10,202,127 B2 * 2/2019 Shiraishi ............... B60W 50/08
10,440,096 B2 * 10/2019 Sabella ............. H04W 28/0205
(Continued)

OTHER PUBLICATIONS

Watts, "Digital Twins in the Automotive Industry," retrieved from the Internet at https://bit.ly/33vbOQj, Oct. 29, 2018, 7 pages.

*Primary Examiner* — Charles J Han
(74) *Attorney, Agent, or Firm* — Burbage Law, P.C.; Jon-Michael Burbage

(57) ABSTRACT

The disclosure includes embodiments including a vehicular edge server switching mechanism based on historical data and digital twin simulations. A method includes causing a sensor set of a connected vehicle to determine a current driving context of the connected vehicle. A method includes comparing the current driving context to a set of digital twin data and a set of historical data to determine a predicted latency for using offboard computing resources of an edge server. The method includes determining that the predicted latency for using the offboard computing resources satisfies a threshold for the predicted latency. The method includes executing a switching decision that includes deciding to use the offboard computing resources of the edge server based on the comparing of the current driving context to the set of digital twin data and the set of historical data and the determining that the threshold for the predicted latency is satisfied.

20 Claims, 5 Drawing Sheets

(58) Field of Classification Search
CPC ........... G06F 30/20; H04W 4/00; H04W 4/02;
H04W 4/029; H04W 4/30; H04W 4/40
See application file for complete search history.

(56) References Cited

U.S. PATENT DOCUMENTS

| | | |
|---|---|---|
| 2017/0286572 A1 | 10/2017 | Hershey et al. |
| 2018/0146323 A1* | 5/2018 | Tseng .................... H04W 4/80 |
| 2019/0266294 A1 | 8/2019 | Dogru |

* cited by examiner

VEHICULAR EDGE SERVER SWITCHING MECHANISM BASED ON HISTORICAL DATA AND DIGITAL TWIN SIMULATIONS

BACKGROUND

The specification relates to a vehicular edge server switching mechanism based on historical data and digital twin simulations.

Edge computing is an emerging technology for connected vehicles. Edge computing may soon be implemented at strategically important roadside locations.

Edge computing is implemented by installing an edge server in a roadside unit ("RSU"); the edge server then optionally communicates with a cloud server.

Edge computing is beneficial to connected vehicles for various reasons, including, for example: (1) expanding the computational ability of vehicle's onboard computer systems by allowing them to access the computational resources of the edge server, cloud server, and/or other vehicles; (2) allowing vehicles to share important data with one another [e.g., sensor data, future vehicle decisions, any other important digital data which can be shared among vehicles]; and (3) allowing vehicles to participate in other vehicle cloudification.

SUMMARY

Vehicles have their own onboard computers, sensors, and sensor data (herein "onboard resources"). However, these onboard resources may not be as good as those that are available by accessing a roadside edge server (e.g., an edge server that is an element of a roadside device). A downside to edge computing is the latency involved in accessing the services of the edge server. Because of this, it is not the best decision to always access edge servers—in some situations, it is better for the vehicle to just use its onboard resources because the latency is too great or inappropriate for the situation.

Accordingly, a problem is a "switching mechanism" is needed that determines when it is best for a vehicle to use onboard resources or the resources of an edge server ("offboard resources").

Described herein are embodiments a switching system. In some embodiments, the switching system is operable to provide a "switching mechanism" that determines when it is best for a vehicle to use onboard resources or the resources of an edge server.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

One general aspect includes a method including: causing a sensor set of a connected vehicle to determine a current driving context of the connected vehicle; comparing, by an onboard vehicle computer of the connected vehicle, the current driving context to a set of digital twin data and a set of historical data to determine a predicted latency for using offboard computing resources of an edge server which is remote from the connected vehicle, where the set of digital twin data describes a set of latencies for using the offboard computing resources in a set of different driving contexts which were simulated in a set of digital twin simulations which exactly duplicate a real-world experience of the connected vehicle and the set of historical data describes real-world historical latencies for using the offboard computing resources in the set of different driving contexts; determining that the predicted latency for using the offboard computing resources satisfies a threshold for the predicted latency; executing a switching decision that includes deciding to use the offboard computing resources of the edge server based on the comparing of the current driving context to the set of digital twin data and the set of historical data and the determining that the threshold for the predicted latency is satisfied; causing, responsive to the switching decision, the edge server to wirelessly provide digital data generated by the edge server responsive to a calculation; and modifying an operation of the onboard vehicle computer based on the digital data generated by the calculation and provided to the connected vehicle. Other embodiments of this aspect include corresponding computer systems, apparatus, and computer programs recorded on one or more computer storage devices, each configured to perform the actions of the methods.

Implementations may include one or more of the following features. The method where the edge server executes a separate instance of the switching decision and a consensus between the switching decisions of the onboard vehicle computer and the edge server is required in order for the calculation to be executed by the edge server. The method further including determining whether the calculation improved the operation of the onboard vehicle computer. The method further including updating the set of digital twin data responsive to determining that the calculation did not improve the operation of the onboard vehicle computer so that a future switching decision is improved. The method further including updating the set of historical data responsive to determining that the calculation did not improve the operation of the onboard vehicle computer so that a future switching decision is improved. The method further including determining an actual latency resulting from the switching decision. The method further including: determining whether the set of digital twin data or the set of historical data more accurately predicted the actual latency; determining a first weight to apply to the set of digital twin data in a future switching decision and a second weight to apply to the set of historical data in the future switching decision; and executing the future switching decision based on the set of digital twin data as modified by the first weight and the set of historical data as modified by the second weight. The method where the digital data describes a sensor measurement recorded by a remote vehicle. The method where the digital data describes an output of a computational process executed by the edge server for the connected vehicle. Implementations of the described techniques may include hardware, a method or process, or computer software on a computer-accessible medium.

One general aspect includes a computer program product installed in an onboard unit of a connected vehicle, the computer program product including codes and routines that are operable, when executed by the onboard unit, to cause the onboard unit to execute steps including: causing a sensor set of a connected vehicle to determine a current driving context of the connected vehicle; comparing, by an onboard vehicle computer of the connected vehicle, the current driving context to a set of digital twin data and a set of historical data to determine a predicted latency for using offboard computing resources of an edge server which is remote from the connected vehicle, where the set of digital twin data describes a set of latencies for using the offboard computing resources in a set of different driving contexts which were simulated in a set of digital twin simulations which exactly duplicate a real-world experience of the connected vehicle and the set of historical data describes real-world historical latencies for using the offboard computing resources in the set of different driving contexts; determining that the predicted latency for using the offboard computing resources satisfies a threshold for the predicted latency; executing a switching decision that includes deciding to use the offboard computing resources of the edge server based on the comparing of the current driving context to the set of digital twin data and the set of historical data and the determining that the threshold for the predicted latency is satisfied; causing, responsive to the switching decision, the edge server to wirelessly provide digital data generated by the edge server responsive to a calculation; and modifying an operation of the onboard vehicle computer based on the digital data generated by the calculation and provided to the connected vehicle. Other embodiments of this aspect include corresponding computer systems, apparatus, and computer programs recorded on one or more computer storage devices, each configured to perform the actions of the methods.

Implementations may include one or more of the following features. The computer program product where the edge server executes a separate instance of the switching decision and a consensus between the switching decisions of the onboard vehicle computer and the edge server is required in order for the calculation to be executed by the edge server. The computer program product where the computer program product includes additional codes and routines that are operable, when executed by the onboard unit, to cause the onboard unit to execute steps including determining whether the calculation improved the operation of the onboard vehicle computer. The computer program product where the computer program product includes additional codes and routines that are operable, when executed by the onboard unit, to cause the onboard unit to execute steps including updating the set of digital twin data responsive to determining that the calculation did not improve the operation of the onboard vehicle computer so that a future switching decision is improved. The computer program product where the computer program product includes additional codes and routines that are operable, when executed by the onboard unit, to cause the onboard unit to execute steps including updating the set of historical data responsive to determining that the calculation did not improve the operation of the onboard vehicle computer so that a future switching decision is improved. The computer program product where the computer program product includes additional codes and routines that are operable, when executed by the onboard unit, to cause the onboard unit to execute steps including determining an actual latency resulting from the switching decision. The computer program product where the computer program product includes additional codes and routines that are operable, when executed by the onboard unit, to cause the onboard unit to execute steps including: determining whether the set of digital twin data or the set of historical data more accurately predicted the actual latency; determining a first weight to apply to the set of digital twin data in a future switching decision and a second weight to apply to the set of historical data in the future switching decision; and executing the future switching decision based on the set of digital twin data as modified by the first weight and the set of historical data as modified by the second weight. The computer program product where the digital data describes a sensor measurement recorded by a remote vehicle. The computer program product where the digital data describes an output of a computational process executed by the edge server for the connected vehicle. Implementations of the described techniques may include hardware, a method or process, or computer software on a computer-accessible medium.

One general aspect includes a system of a connected vehicle including: an onboard vehicle computer communicatively coupled to a non-transitory memory and a sensor set of the connected vehicle, where the onboard vehicle computer is operable to retrieve computer-executable code from the non-transitory memory which is operable, when executed by the onboard vehicle computer, to cause the onboard vehicle computer to: cause the sensor set of a connected vehicle to determine a current driving context of the connected vehicle; compare, by the onboard vehicle computer of the connected vehicle, the current driving context to a set of digital twin data and a set of historical data to determine a predicted latency for using offboard computing resources of an edge server which is remote from the connected vehicle, where the set of digital twin data describes a set of latencies for using the offboard computing resources in a set of different driving contexts which were simulated in a set of digital twin simulations which exactly duplicate a real-world experience of the connected vehicle and the set of historical data describes real-world historical latencies for using the offboard computing resources in the set of different driving contexts; determine that the predicted latency for using the offboard computing resources satisfies a threshold for the predicted latency; execute a switching decision that includes deciding to use the offboard computing resources of the edge server based on the comparison of the current driving context to the set of digital twin data and the set of historical data and the determination that the threshold for the predicted latency is satisfied; cause, responsive to the switching decision, the edge server to wirelessly provide digital data generated by the edge server responsive to a calculation; and modify an operation of the onboard vehicle computer based on the digital data generated by the calculation and provided to the connected vehicle. Other embodiments of this aspect include corresponding computer systems, apparatus, and computer programs recorded on one or more computer storage devices, each configured to perform the actions of the methods.

Implementations may include one or more of the following features. The system where the edge server executes a separate instance of the switching decision and a consensus between the switching decisions of the onboard vehicle computer and the edge server is required in order for the calculation to be executed by the edge server. Implementations of the described techniques may include hardware, a method or process, or computer software on a computer-accessible medium.

BRIEF DESCRIPTION OF THE DRAWINGS

The disclosure is illustrated by way of example, and not by way of limitation in the figures of the accompanying drawings in which like reference numerals are used to refer to similar elements.

DETAILED DESCRIPTION

Figure 1:
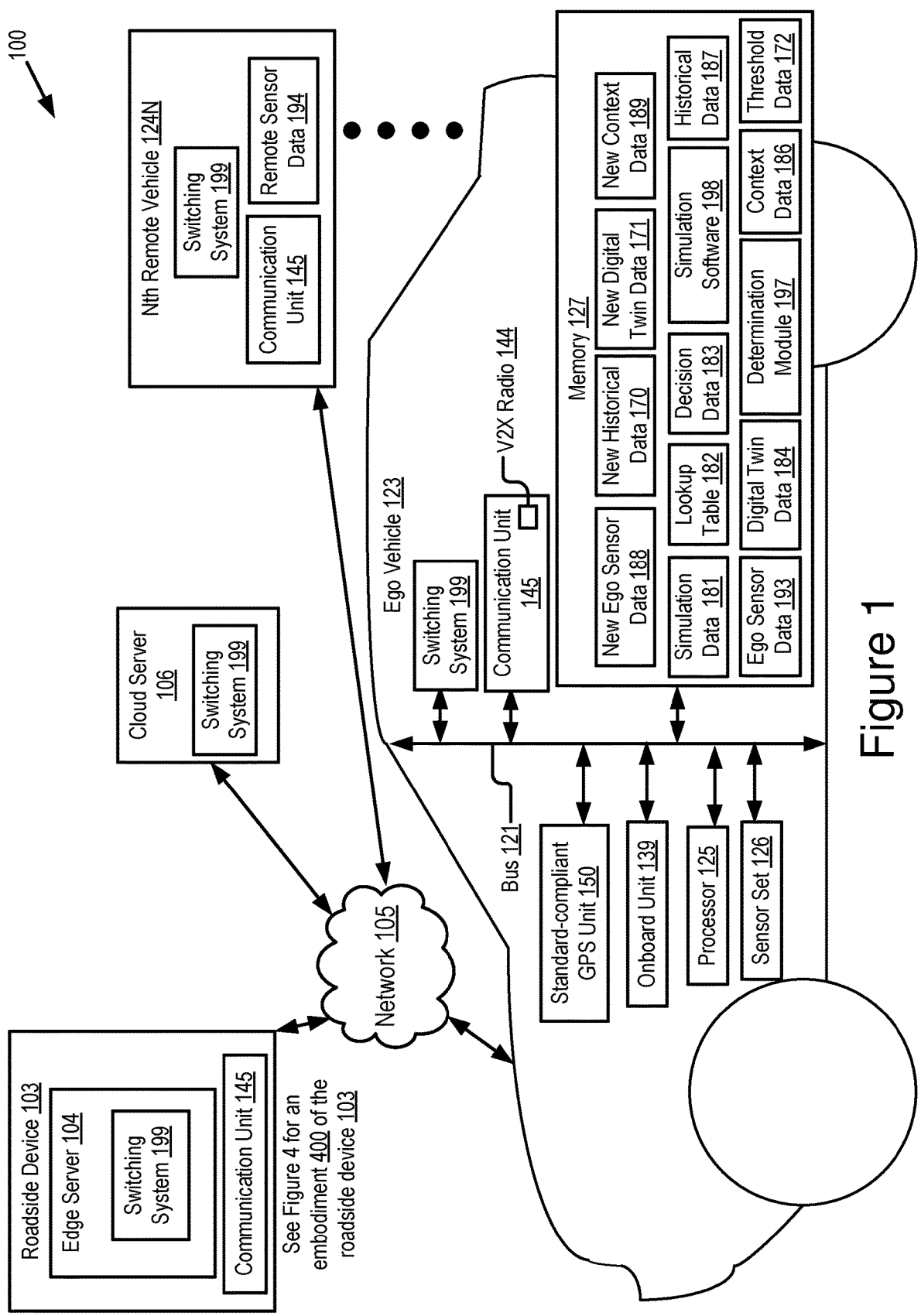
FIG. 1 is a block diagram illustrating an operating environment for a switching system according to some embodiments.

Described herein are embodiments of a switching system that is operable to provide a vehicular edge server switching mechanism based on historical data and digital twin simulations.

Context Data

In some embodiments, the switching system includes codes and routines that are operable, when executed by a processor, to cause the processor to determine the current context of the connected vehicle. The current context is described by sensor data. The current context describes the driving context of the connected vehicle (i.e., "vehicular context") as well as the context of a vehicular network (i.e., "network context"). Both the connected vehicle and an edge server are endpoints of the vehicular network.

Historical Data

Over time the switching system builds historical data. The historical data is digital data that describes (1) different vehicular contexts, (2) different network contexts, and (3) for different combinations of vehicular contexts and network contexts, whether it would be better to use onboard resources of the connected vehicles or the resources of an edge server.

In some embodiments, the switching system uses the historical data to determine, based on the current context of the connected vehicle relative to the historical data, whether to use (1) the onboard resources of the connected vehicle or (2) the resources of the edge server. This decision is referred to herein as a "switching decision."

In some embodiments, the historical data used for the switching decision is retrieved by the switching system from a lookup table. For example, the switching system uses the historical data to build a lookup table that stores and organizes the historical data. In some embodiments, the lookup table is organized so that instances of context data (i.e., digital data describing different vehicular contexts and network contexts) are received as inputs and the lookup table outputs digital data that describes onboard resources or offboard resources has historically resulted in a better outcome for the particular combination of vehicular contexts and network contexts described by the context data.

Digital Twin Simulations

The switching system includes code and routine that are operable, when executed by a processor, to cause the processor to execute a set of digital twin simulations. Digital twins and using digital twins in simulations is described in U.S. patent application Ser. No. 15/908,768 filed on Feb. 28, 2018 and entitled "Proactive Vehicle Maintenance Scheduling based on Digital Twin Simulations" as well as U.S. patent application Ser. No. 16/007,693 filed on Jun. 13, 2018 and entitled "Digital Twin for Vehicle Risk Evaluation," the entirety of each of which is hereby incorporated by reference. In some embodiments, the switching system 199 includes some or all of the simulation software and digital data described in these patent applications.

Over time, the switching system executes digital twin simulations that generate digital twin data. The digital twin data is digital data that describes whether it would be better to use onboard resources of the connected vehicles or the resources of an edge server for different vehicular contexts and different network contexts.

In some embodiments, the digital twin data is included in the lookup table that also includes the historical data.

The historical data is digital data that describes (1) different vehicular contexts, (2) different network contexts, and (3) for different combinations of vehicular contexts and network contexts, whether it would be better to use onboard resources of the connected vehicles or the resources of an edge server.

In some embodiments, the switching system uses the digital twin data to determine, based on the current context of the connected vehicle relative to the digital twin data, whether to use (1) the onboard resources of the connected vehicle or (2) the resources of the edge server. This decision is also referred to as a "switching decision." In some embodiments, the switching decision is based on only the historical data. In some embodiments, the switching decision is based on only the digital twin data. In some embodiments, the switching decision is based on a combination of the historical data and the digital twin data.

In some embodiments, the digital twin data used for the switching decision is retrieved by the switching system from a lookup table. For example, the switching system uses the digital twin data to build a lookup table that stores and organizes the digital twin data. In some embodiments, the lookup table is organized so that instances of context data (i.e., digital data describing different vehicular contexts and network contexts) are received as inputs to the lookup table and the lookup table outputs digital twin data that describes whether, during the digital twin simulations executed by the switching system based on the historical data, onboard resources or offboard resources have resulted in a better outcomes for the particular combination of vehicular contexts and network contexts described by the context data which is received as the inputs.

In some embodiments, the digital twin data is stored in a lookup table that is different than the historical data.

Historical Lookup Table

In some embodiments, a lookup table that includes historical data for different contexts (both vehicular contexts and network contexts) is referred to as a historical lookup table. A historical lookup table does not include digital twin data. An example of a historical lookup table according to some embodiments includes the historical lookup table 505 depicted in FIG. 5.

In some embodiments, the historical lookup table is organized to (1) receive an instance of context data as an input and then (2) output an instance of historical data describing, for the particular context described by the context data, whether onboard resources or offboard resources are predicted to result in a better outcome based on the historical outcomes of switching decisions observed by the switching system.

Digital Twin Lookup Table

In some embodiments, a lookup table that includes digital twin data for different contexts (both vehicular contexts and network contexts) is referred to as a digital twin lookup table. A digital twin lookup table does not include historical data. An example of a digital twin lookup table according to some embodiments includes the digital twin lookup table 510 depicted in FIG. 5.

In other words, the digital twin lookup table is organized to (1) receive an instance of context data as an input and then (2) output an instance of digital twin data describing, for the particular context described by the context data, whether onboard resources or offboard resources are predicted to result in a better outcome based on the digital twin simulations executed by the switching system.

In some embodiments, the switching system makes the switching decision based on both (1) historical data received from a historical lookup table and (2) digital twin data received from a digital twin lookup table.

Set of Factors

In some embodiments, the switching decision considers a set of factors when determining whether to implement the switching decision. For example, these factors include, among others, one or more of the following: the time sensitivity of the vehicle's current context (e.g., is it making a safety critical decision?); and the latency expected by using the resources of the edge server versus the quality of the decision that would be made by the vehicle if it relied solely on its own onboard resources. A safety critical decision includes, for example, a decision that would prevent a collision or a near miss involving the vehicle.

Example General Method

In some embodiments, the switching system includes code and routines that are operable, when executed by the onboard unit, to cause the onboard unit to execute one or more steps of the following example general method:

Step 1: The switching system of the ego vehicle collects historical data.

In some embodiments, the historical data is digital data that describes one or more of the following types of information about a switching decision made by the switching system: (1) sensor data including digital data describing the environment at the time that a switching decision was made; (2) whether onboard resources (i.e., the resources of the ego vehicle) or offboard resources (i.e., the resources of the edge server) where used as the result of the switching decision; (3) for using offboard resources, latency information describing the latency of using offboard resources; (4) context data including digital data describing the context of the resource usage (e.g., one or more of the vehicle context and the network context); (5) a description of whether the outcome from the switching decision was successful or unsuccessful (e.g., a historical switching decision); etc. In some embodiments, the context data is a combination of the sensor data and the context information described above. An example of the context data according to some embodiments includes the context data 186 depicted in FIG. 1.

The context data includes digital data describing a roadway context or driving context of the vehicle that includes the switching system (i.e., "vehicular context") as well as the context of a vehicular network (i.e., "network context") which is used by the vehicle to send and receive wireless messages. As used herein, the term "vehicle" refers to a connected vehicle. The ego vehicle mentioned above is an example of a connected vehicle that includes the switching system as an element of one or more of its onboard vehicle computers.

Examples of vehicular context described by the context data include one or more of the following: a roadway context of the roadway on which the vehicle travels (e.g.: weather conditions; whether the roadway is dry, icy, or wet; the lighting conditions; whether the roadway is crowded; how many vehicles are traveling in some or all of the lanes of the roadway, etc.), and a driving context of the vehicle (e.g., emergency situation, non-emergency situation, uncertain about the emergency status of the situation, vehicle speed, vehicle acceleration, vehicle deceleration, roadway type, (e.g., highway, interstate, rural road, feeder, etc.), which lane the vehicle is traveling in, whether the vehicle is traveling in an exit lane, on an off-ramp, on an on-ramp, a presence or absence of roadway construction, etc.).

Examples of network context described by the context data include one or more of the following: whether the network is congested; which channels of the V2X radio are congested; the latency of the network; the latency of some or all of the channels; how many other vehicles are attempting to transmit V2X messages via the network; for some or all of the channels, how many other vehicles are attempting to transmit V2X messages via the network, etc.).

In some embodiments, the contexts described by the context data are a subset of the measurements recorded by the sensor set of the ego vehicle and described by the ego sensor data. In some embodiments, the context data describes any context which is explicit, implicit, inferable, or calculable based on the sensor measurements that are recordable by some or all of the sensors included in the sensor set.

In some embodiments, the information described above for step 1 is outputted to an edge server or a cloud server and these endpoints include a switching system that builds the lookup tables.

Ego sensor data and remote sensor data are examples of sensor data. Ego sensor data includes sensor data recorded by a sensor set of an ego vehicle. Remote sensor data includes sensor data recorded by a sensor set of a remote vehicle. In some embodiments, the remote sensor data is recorded at a time to and the ego sensor data is recorded at a later time ti. These times to and ti form a range of times where time to is a beginning of the range and time ti is an end of the range.

An example of the ego sensor data includes the ego sensor data 193 depicted in FIG. 1. The remote sensor data 194 depicted in FIG. 1 includes similar elements as the ego sensor data 193 with the difference being that the remote sensor data 194 is recorded by one of the Nth remote vehicle 124 whereas the ego sensor data 193 is recorded by the ego vehicle 123. As used herein, N refers to any positive whole number greater than zero. The Nth remote vehicle 124 may be referred to herein as the "remote vehicle 124."

In some embodiments, the ego sensor data is digital data that describes one or more of the following types of information about a switching decision made by the switching system: sensor data describing a vehicular context and a network context at a time when a switching decision was made: whether onboard resources or offboard resources (i.e., the resources of the edge server) where used as the result of the switching decision; for offboard usage, latency information describing the latency of using offboard resources; context data describing the context of the resource usage (e.g., emergency, non-emergency, other information that describes the context of the usage, etc.); a description of whether the outcome from the switching decision was successful; etc.

In some embodiments, the switching system of the ego vehicle includes code and routines that are operable, when executed by a processor, to cause the sensors of the ego vehicle to measure and record the sensor measurements that are described by the ego sensor data.

In some embodiments, the remote vehicle also includes a switching system. The switching system of the remote vehicle includes code and routines that are operable, when executed by a processor, to cause the sensors of the remote vehicle to measure and record the sensor measurements that are described by the remote sensor data.

Step 2: The switching system of the ego vehicle builds a historical lookup table based on the historical data. Optionally, the historical data is outputted to the edge server or the cloud server and these endpoints include a switching system that builds the historical lookup table.

An example of the historical data according to some embodiments includes the historical data 187 as depicted in FIG. 1. The historical data 187 includes digital data that describes the ego sensor data 193 and any remote sensor data 194 which is received by the ego vehicle. In some embodiments, two or more instances of remote sensor data 194 are received by the ego vehicle from two or more remote vehicles.

In some embodiments, the historical data is outputted to the edge server or the cloud server and these endpoints include a switching system that builds the lookup table. An example of the lookup table includes the lookup table 182 depicted in FIG. 1. In some embodiments, the lookup table 182 includes the historical data 187 which is organized as a historical lookup table.

In some embodiments, the historical lookup table includes a data structure that organizes the contexts observed by sensors and described in the ego sensor data (and, optionally, in remote sensor data), the switching decision which was arrived in past executions of the switching system for these contexts (which might also be described by instances of decision data included in the historical lookup table and organized so that the switching decisions arrived at for different contexts are retrievable by the historical lookup table), and the outcome (e.g., a latency experienced, whether a collision was avoided or not, whether a calculation was improved or different because it was executed by the edge server or the ego vehicle, etc.) which resulted from the switching decision (this outcome is also described by the decision data in some embodiments). The decision data is digital data that describes a current or past switching decision and its outcome. An example of the decision data according to some embodiments includes the decision data 183 depicted in FIG. 1.

In some embodiments, the historical lookup table is a data structure that is configured by the switching system to receive queries from the switching system and return specific instances of the decision data based on the queries. In some embodiments, (1) the queries include digital data that describes a current context of the ego vehicle as described by the new context data and (2) the responses include decision data for past events whose context were most similar to the context described by the new context data. The new context data is described in more detail below with reference to the step 9 of this example general method.

Step 3: Step 1 is repeated by the switching systems of the remote vehicles which then provide their remote sensor data to the edge server, cloud server, or ego vehicle as an input to step 4.

Step 4: Analyze the historical data to generate simulation data. An example of the historical data according to some embodiments includes the historical data 187 depicted in FIG. 1.

The switching system includes simulation software that is operable to execute a set of digital twin simulations. Digital twins and using digital twins in simulations is described in U.S. patent application Ser. No. 15/908,768 filed on Feb. 28, 2018 and entitled "Proactive Vehicle Maintenance Scheduling based on Digital Twin Simulations" as well as U.S. patent application Ser. No. 16/007,693 filed on Jun. 13, 2018 and entitled "Digital Twin for Vehicle Risk Evaluation," the entirety of each of which is hereby incorporated by reference. In some embodiments, the switching system 199 includes some or all of the simulation software and digital data described in these patent applications.

In some embodiments, the simulation software includes a game engine which is operable to execute the digital twin simulations. An example of a suitable game engine includes the Unity game engine published by Unity Technologies of San Francisco, Calif.

The simulation data is digital data that is operable, when executed by a processor (e.g., an onboard unit of the ego vehicle), to cause the simulation software to execute a set of digital twin simulations which exactly duplicate the real-world experience of the ego vehicle and the remote vehicles (assuming that remote sensor data is provided as an input to the switching system).

The historical data includes one or more of the ego sensor data and the remote sensor data from one or more remote vehicles. In some embodiments, the ego sensor data and the remote sensor data provide enough information, based on the sensor measurements recorded by the ego vehicle and the remote vehicle, to provide this degree of similarity between the real-world and the simulations executed by the simulation software of the switching system. An example of the simulation data according to some embodiments includes the simulation data 181 depicted in FIG. 1.

In some embodiments, the simulation data is configured so that the simulations executed by the switching system replicate real-world events as described by one or more of the ego sensor data and the remote sensor data. In this way, executing the simulations enables the switching system to predict the outcome of different switching decisions in different contexts as described by the ego sensor data and the remote sensor data.

Step 5: The switching system executes digital twin simulations based on the simulation data. The output of these digital twin simulations is the digital twin data.

In some embodiments, the digital twin data is digital data that describes outcomes of the switching decisions which occurred during the digital twin simulations. In some embodiments, the simulation data is configured by the switching system so that the different digital twin simulations executed by the simulation software are configured to test the effectiveness of different switching decisions in different contexts (different vehicular contexts and/or different network contexts). In this way, executing the simulations enables the switching system to predict the outcome of different switching decisions in different contexts as described by the ego sensor data and the remote sensor data which are recreated in the digital twin simulations which are executed by the switching system based on the simulation data.

An example of the digital twin data according to some embodiments includes the digital twin data 184 depicted in FIG. 1.

In some embodiments, the switching system 199 includes simulation software which is operable to execute the digital twin simulations based on the simulation data. In some embodiments, the simulation software is also operable to generate the digital twin data. In some embodiments, the simulation software includes a game engine which receives the simulation data as an input and outputs the digital twin data 184 as an output after the digital twin simulations are executed by the simulation software. Examples of the simulation software are described in in U.S. patent application Ser. No. 15/908,768 filed on Feb. 28, 2018 and entitled "Proactive Vehicle Maintenance Scheduling based on Digital Twin Simulations" as well as U.S. patent application Ser. No. 16/007,693 filed on Jun. 13, 2018 and entitled "Digital Twin for Vehicle Risk Evaluation," the entirety of each of which is hereby incorporated by reference.

An example of the simulation software according to some embodiments includes the simulation software 198 depicted in FIG. 1.

Step 6: The switching system of the ego vehicle builds a digital twin lookup table based on the simulation data and the digital twin data.

In some embodiments, the digital twin lookup table includes a data structure that organizes the contexts recreated in the digital twin simulations (as described by the simulation data), the switching decision which was arrived at during the execution of these digital twin simulations (as described by the digital twin data, which can be described as a simulated version of the decision data which is arrived at via digital twin simulations instead of real-life historical events), and the outcome (e.g., a latency experienced, whether a collision was avoided or not, whether a calculation was improved or different because it was executed by the edge server or the ego vehicle, etc.) which resulted from the switching decision (this outcome is also described by the digital twin data).

In some embodiments, the lookup table is a data structure that is configured by the switching system to receive queries from the switching system and return specific instances of the digital twin data based on the queries. In some embodiments, the queries include digital data that describes a current context of the ego vehicle as described by the new context data. The new context data is described in more detail below with reference to the step 9 of this example general method.

In some embodiments, the lookup table is a database or some other data structure. An example of the lookup table according to some embodiments includes the lookup table 182 depicted in FIG. 1. In some embodiments, the lookup table depicted in FIG. 1 includes both a historical lookup table and a digital twin lookup table.

In some embodiments, the simulation data is outputted to the edge server or the cloud server and these endpoints include a switching system that builds the digital twin lookup table. These endpoints then transmit V2X messages to the ego vehicle that include the digital twin lookup table so that the ego vehicle stores the digital twin lookup table which was built remotely. In another alternative, the digital twin lookup table is stored remotely and the edge server or the cloud server receives and responds to queries to the digital twin lookup table from the switching system of the ego vehicle; the queries include new context data and the responses include digital twin data for the simulations which have a context most similar to the new context data.

Step 7: The switching system of the ego vehicle includes codes and routines that are operable, when executed by a processor of the ego vehicle, to cause the sensors of the ego vehicle to measure and record new sensor measurement the new ego sensor data. The new sensor measurements included in the new ego sensor data are recorded at a later time relative to the prior sensor measurements which are included in the ego sensor data that is included in historical data. An example of the new ego sensor data according to some embodiments includes the new ego sensor data 188 depicted in FIG. 1.

Step 8: The switching system includes codes and routines that are operable, when executed by a processor, to determine that a switching decision needs to be made. In some embodiments, this determination is made based on analysis of the ego sensor data.

For example, the new ego sensor data indicates a scenario where the new ego sensor data could be improved by being supplemented by the remote sensor data of the remote vehicles provided that a latency threshold is satisfied.

In some embodiments, the latency threshold is described by threshold data that is stored in a non-transitory memory of the ego vehicle. The threshold data is digital data that describes the latency threshold. An example of the threshold data in some embodiments includes the threshold data 172 depicted in FIG. 1.

The remote sensor data is similar to the ego sensor data although it describes the environment of a remote vehicle from the perspective of the sensors of the remote vehicle. In some embodiments, the remote sensor data is received from one or more remote vehicles via one or more V2X messages that are received by a communication unit of the ego vehicle.

In another example, the switching decision is triggered because the switching system determines that a vehicular operation may be benefited by a computational service provided by the edge server or cloud computing provided by the edge server and/or the remote vehicles provided that some threshold is satisfied. This threshold is described by the threshold data. The threshold includes any threshold relevant to the performance of the vehicular operation. The vehicular operation includes any service, computation, or output that is provided by any component of the ego vehicle. For example, the vehicular operation includes the functionality provided by the execution of an Advanced Driver Assistance System (ADAS) of the ego vehicle.

In another embodiment, the switching decision is initiated by the switching system responsive to the switching system determining that the edge server includes computational abilities that exceed the computational abilities of the ego vehicle.

In some embodiments, the decision data includes digital data that describes the switching decision made at step 8. An example of the decision data according to some embodiments includes the decision data 183 depicted in FIG. 1.

Step 9: The switching system of the ego vehicle determines a current context for the switching decision identified at step 8. In some embodiments, this current context is described by new context data. In some embodiments, the current context is determined based on the new ego sensor data.

The new context data includes digital data that describes, for example, various types of context which affect the ego vehicle. For example, the new context data may describe a roadway context of the roadway on which the vehicle travels (e.g.: weather conditions; whether the roadway is dry, icy, or wet; the lighting conditions; whether the roadway is crowded; how many vehicles are traveling in some or all of the lanes of the roadway, etc.), a driving context of the vehicle (e.g., emergency situation, non-emergency situation, uncertain about the emergency status of the situation, vehicle speed, vehicle acceleration, vehicle deceleration, roadway type, (e.g., highway, interstate, rural road, feeder, etc.), which lane the vehicle is traveling in, whether the vehicle is traveling in an exit lane, on an off-ramp, on an on-ramp, a presence or absence of roadway construction, a presence or absence of pedestrians on a roadway, a presence or absence of emergency workers or police officer on a roadway, a presence or absence of a collision scene on a roadway, etc.), and a network context of the wireless network which the vehicle uses for V2X communications (e.g.:

whether the network is congested; which channels of the V2X radio are congested; the latency of the network; the latency of some or all of the channels; how many other vehicles are attempting to transmit V2X messages via the network; for some or all of the channels, how many other vehicles are attempting to transmit V2X messages via the network, etc.). The contexts described by the new context data are a subset of the measurements recorded by the sensor set of the ego vehicle and described by the new ego sensor data. In some embodiments, the new context data describes any context which is explicit, implicit, inferable, or calculable based on the sensor measurements that are recordable by some or all of the sensors included in the sensor set.

An example of the new context data according to some embodiments includes the new context data 189 depicted in FIG. 1.

Step 10: The switching system of the ego vehicle includes codes and routines that are operable, when executed by a processor, to cause the processor to compare the new context data to the digital data stored in the lookup table to determine, based on this comparison, whether onboard resources or offboard resources should be used. This step is the switching decision.

The output of step 10 is a new instance of decision data which is configured for the context described by the new context data. Accordingly, although this instance of decision data is similar to the decision data stored in the historical lookup table because they both describe a switching decision, the decision data that is outputted at step 10 is different because is configured for the context described by the new context data which describes a most recent context of the ego vehicle whereas the decision data stored in the lookup table was configured by the switching system based on an instance of context data that described the context of the ego vehicle in the past.

Step 10 is now described in more detail according to some embodiments.

In some embodiments, the switching system of the ego vehicle includes codes and routines that are operable, when executed by a processor, to cause the processor to compare the new context data to the digital data stored in the historical lookup table to determine, based on this comparison, whether onboard resources or offboard resources should be used.

In some embodiments, the switching system of the ego vehicle includes codes and routines that are operable, when executed by a processor, to cause the processor to compare the new context data to the digital data stored in the digital twin lookup table to determine, based on this comparison, whether onboard resources or offboard resources should be used.

In some embodiments, the switching system of the ego vehicle includes codes and routines that are operable, when executed by a processor, to cause the processor to compare the new context data to the digital data stored in both the historical lookup table and the digital twin lookup table to determine, based on these comparisons, whether onboard resources or offboard resources should be used.

In some embodiments, the switching system includes codes and routines that are operable, when executed by a processor, to cause the processor to query the digital twin lookup table using the new context data and receive digital twin data which is the output of one or more simulations that included contexts similar to those described by the new context data. The switching system then analyses this digital twin data to determine, based on this digital twin data and optionally digital data describing other factors, which switching decision to make for the current context. This output of this analysis is the decision data.

In some embodiments, the switching system includes codes and routines that are operable, when executed by a processor, to cause the processor to query the historical lookup table using the new context data and receive decision data describing a past switching decision whose context data is most similar to the new context data. The switching system then analyzes this decision data to determine, based on this decision data and optionally digital data describing other factors, which switching decision to make for the current context. The output of this analysis is a new instance of decision data.

In some embodiments, the switching system includes codes and routines that are operable, when executed by a processor, to cause the processor to query one or more of the digital twin lookup table and the historical lookup table using the new context data and receive one or more of digital twin data from the digital twin lookup table and decision data from the historical lookup table to determine an instance of decision data for the new context which the ego vehicle is presently experiencing.

The decision data outputted at step 10 is digital data that describes the switching decision for the new context data.

In some embodiments, the switching system may also consider the threshold data at step 10 to ensure, for example, that a threshold for latency is satisfied before using offboard resources.

In some embodiments, both the edge server and the ego vehicle have to decide that using offboard resources is best before a decision will be made by the switching system to use offboard resources. This is described in more detail below with regards to "consensus."

Step 11: The switching system of the ego vehicle uses either offboard or onboard resources based on the switching decision made at step 10.

Step 12: The switching system determines the outcome of the switching decision made at step 10. For example, the switching system determines answer to the question of whether the switching decision was successful or unsuccessful. The answer to this question may be indicated, for example, based on the quality of the decision made using only ego sensor data [i.e., onboard resource usage] or the latency associated with using local sensor data and also remote sensor data [i.e., offboard resource usage].

Step 13: The switching system of the ego vehicle generates new digital twin data based on the outcome of step 12.

For example, the switching system analyzes the outcome of the switching decision to determine if performance (e.g., predicted latency versus actual latency, or some other measurement of performance) or an outcome was improved by using offboard resources (e.g., a collision was avoided, a near miss collision was avoided, or some other attribute improving safety or a driver's confidence in the ego vehicle was achieved, a calculation of an onboard vehicle computer of the ego vehicle was improved). Based on this analysis, new historical data is generated.

For example, the new historical data includes digital data that describes one or more of the following: the switching decision that was made at step 10; the context for this switching decision (e.g., the driving context, the network context, etc.); and whether performance of a communication (e.g., as measured by actual observed latency versus expected latency), an outcome for the communication (e.g., was the communication actually successful or received on time), or performance of an onboard vehicle computer of the ego vehicle, or some other aspect of a vehicular operation was improved by using offboard resources as specified by the switching decision.

An example of the new historical data includes in some embodiments the new historical data 170 depicted in FIG. 1.

The switching system then updates the simulation data based on the new historical data and executes additional digital twin simulations based on this updated version of the simulation data. For example, the switching system updates the simulation data to test for what outcomes result from new contexts or other information that are described by the new historical data 170. The output of these new digital twin simulations is new digital twin data. The new digital twin data includes digital data that describes the outcomes of the digital twin simulations that are executed based on the updated simulation data.

An example of the new digital twin data includes in some embodiments the new digital twin data 171 depicted in FIG. 1.

Step 14: The switching system of the ego vehicle updates the digital twin lookup table using the new digital twin data outputted at step 13.

In some embodiments, the switching system of the ego vehicle updates the historical lookup table using the new historical data at step 13.

The steps described above may be executed in any order and not necessarily the order depicted above. In some embodiments, some of the steps depicted above may be omitted.

In some embodiments, the switching system includes a determination module. The determination module includes code and routines that are operable, when executed by a processor, to cause the processor to execute one or more of steps 1-14 described above. An example of the determination module includes the determination module 197 depicted in FIG. 1.

Consensus

In some embodiments, the switching system is also installed in an edge server or a cloud server. For example, see the edge server 104 depicted in FIG. 1 as an element of the roadside device. In some embodiments, some of the functionality of the switching system is executed by the edge server and not the vehicle.

In some embodiments, the switching systems of the edge server (or cloud server) and the vehicle (e.g., the ego vehicle 123 depicted in FIG. 1) each execute the switching decision and a determination is made about whether there is a consensus between the switching decisions of the vehicle and the edge server (or the cloud server); in some embodiments, a consensus is required among the switching decisions of the switching system of the vehicle and the switching system of edge server in order for the vehicle to switch to using the resources of the edge server For example, a consensus among the switching systems of the edge server and the ego vehicle are required in order for the switching system of the ego vehicle to execute steps 10-13 of the example general method described above.

A consensus means that these two switching systems of the ego vehicle and the edge sever (or cloud server) have to determine the same switching decision in order for the ego vehicle to execute the switching decision (e.g., step 10 described above).

In some embodiments, the sensor data of the various vehicles which include a switching system is uploaded to a cloud server which includes an instance of the switching system. The switching system of the cloud server collects sensor data from a large number of connected vehicles which also include a switching system. In some embodiments, the switching system of the cloud server builds a historical lookup table. In some embodiments, the switching system of the cloud server executes the digital twin simulations which yield the digital twin data and the digital twin lookup table. The cloud server distributes the digital data included in one or more of the the digital twin lookup table and the historical lookup table to the various connected vehicles.

In some embodiments, the connected vehicles are those which are manufactured by a particular manufacturer. In some embodiments, this functionality of generating the digital twin lookup table and/or the historical lookup table is provided by an edge server instead of a cloud server.

In some embodiments, a consensus is required between the historical data and the digital twin simulations Weighting In some embodiments, the switching system includes code and routines that are operable, when executed by a processor, to cause the processor to give more weight to the decision data outputted by a historical lookup table, or alternatively, more weight may be given to the digital twin data outputted by a digital twin lookup table. This weighting may be learned by the switching system over time based on the performance of these methods relative to one another. The weighting may vary based on different contexts and factors which are present at any given time. In this way the switching system learns over time and its performance continuously gets better over time.

DSRC-Equipped Device

A DSRC-equipped device is any processor-based computing device that includes a DSRC transmitter and a DSRC receiver. For example, if a vehicle includes a DSRC transmitter and a DSRC receiver, then the vehicle may be described as "DSRC-enabled" or "DSRC-equipped." Other types of devices may be DSRC-enabled. For example, one or more of the following devices may be DSRC-equipped: an edge server; a cloud server; a roadside unit ("RSU"); a traffic signal; a traffic light; a vehicle; a smartphone; a smartwatch; a laptop; a tablet computer; a personal computer; and a wearable device.

In some embodiments, one or more of the connected vehicles described above are DSRC-equipped vehicles. A DSRC-equipped vehicle is a vehicle that includes a standard-compliant GPS unit and a DSRC radio which is operable to lawfully send and receive DSRC messages in a jurisdiction where the DSRC-equipped vehicle is located. A DSRC radio is hardware that includes a DSRC receiver and a DSRC transmitter. The DSRC radio is operable to wirelessly send and receive DSRC messages on a band that is reserved for DSRC messages.

A DSRC message is a wireless message that is specially configured to be sent and received by highly mobile devices such as vehicles, and is compliant with one or more of the following DSRC standards, including any derivative or fork thereof: EN 12253:2004 Dedicated Short-Range Communication—Physical layer using microwave at 5.8 GHz (review); EN 12795:2002 Dedicated Short-Range Communication (DSRC)—DSRC Data link layer: Medium Access and Logical Link Control (review); EN 12834:2002 Dedicated Short-Range Communication—Application layer (review); and EN 13372:2004 Dedicated Short-Range Communication (DSRC)—DSRC profiles for RTTT applications (review); EN ISO 14906:2004 Electronic Fee Collection—Application interface.

A DSRC message is not any of the following: a WiFi message; a 3G message; a 4G message; an LTE message; a millimeter wave communication message; a Bluetooth message; a satellite communication; and a short-range radio message transmitted or broadcast by a key fob at 315 MHz or 433.92 MHz. For example, in the United States, key fobs for remote keyless systems include a short-range radio transmitter which operates at 315 MHz, and transmissions or broadcasts from this short-range radio transmitter are not DSRC messages since, for example, such transmissions or broadcasts do not comply with any DSRC standard, are not transmitted by a DSRC transmitter of a DSRC radio and are not transmitted at 5.9 GHz. In another example, in Europe and Asia, key fobs for remote keyless systems include a short-range radio transmitter which operates at 433.92 MHz, and transmissions or broadcasts from this short-range radio transmitter are not DSRC messages for similar reasons as those described above for remote keyless systems in the United States.

In some embodiments, a DSRC-equipped device (e.g., a DSRC-equipped vehicle) does not include a conventional global positioning system unit ("GPS unit"), and instead includes a standard-compliant GPS unit. A conventional GPS unit provides positional information that describes a position of the conventional GPS unit with an accuracy of plus or minus 10 meters of the actual position of the conventional GPS unit. By comparison, a standard-compliant GPS unit provides position data that describes a position of the standard-compliant GPS unit with an accuracy of plus or minus 1.5 meters of the actual position of the standard-compliant GPS unit. This degree of accuracy is referred to as "lane-level accuracy" since, for example, a lane of a roadway is generally about 3 meters wide, and an accuracy of plus or minus 1.5 meters is sufficient to identify which lane a vehicle is traveling in even when the roadway has more than one lanes of travel each heading in a same direction.

In some embodiments, a standard-compliant GPS unit is operable to identify, monitor and track its two-dimensional position within 1.5 meters, in all directions, of its actual position 68% of the time under an open sky.

In some embodiments, the switching system includes software that is installed in an onboard unit of a vehicle.

Embodiments of the switching system are now described. Referring now to FIG. 1, depicted is a block diagram illustrating an operating environment 100 for a switching system 199 according to some embodiments.

The operating environment 100 may include one or more of the following elements: an ego vehicle 123 (referred to herein as a "vehicle 123" or an "ego vehicle 123"); an Nth remote vehicle 124 (where "N" refers to any positive whole number greater than one); a roadside device 103; and a cloud server 106. These elements of the operating environment 100 are communicatively coupled to one another via a network 105. These elements of the operating environment 100 are depicted by way of illustration. In practice, the operating environment 100 may include one or more of the elements depicted in FIG. 1. The Nth remote vehicle 124 is referred to herein as a "remote vehicle 124" or a "vehicle 124."

In the depicted embodiment, the ego vehicle 123, the remote vehicle 124, and the edge server 104 include similar elements. For example, each of these elements of the operating environment 100 include their own processor 125, bus 121, memory 127, communication unit 145, sensor set 126, onboard unit 139, switching system 199 and the digital data depicted in FIG. 1 as stored by the memory 127. These elements provide the same or similar functionality relative to one another. Accordingly, these descriptions will not be repeated in this description.

The remote sensor data 194 is generated by a sensor set 126 of the remote vehicle 124. In practice, this digital data may be stored by any endpoint of the network 105. For example, the remote vehicle 124 transmits a V2X message via the network 105 so that the remote sensor data 194 is stored by one or more of the ego vehicle 123, the edge server 104, and the cloud server 106.

In the depicted embodiment, the ego vehicle 123, the remote vehicle 124, and the edge server 104 each store similar digital data. For example, a memory 127 (not pictured) of the remote vehicle 124 may store the digital data depicted in FIG. 1 as stored by the memory 127 of the ego vehicle 123.

The network 105 may be a conventional type, wired or wireless, and may have numerous different configurations including a star configuration, token ring configuration, or other configurations. Furthermore, the network 105 may include a local area network (LAN), a wide area network (WAN) (e.g., the Internet), or other interconnected data paths across which multiple devices and/or entities may communicate. In some embodiments, the network 105 may include a peer-to-peer network. The network 105 may also be coupled to or may include portions of a telecommunications network for sending data in a variety of different communication protocols. In some embodiments, the network 105 includes Bluetooth® communication networks or a cellular communications network for sending and receiving data including via short messaging service (SMS), multimedia messaging service (MMS), hypertext transfer protocol (HTTP), direct data connection, wireless application protocol (WAP), e-mail, DSRC, full-duplex wireless communication, mmWave, WiFi (infrastructure mode), WiFi (ad-hoc mode), visible light communication, TV white space communication and satellite communication. The network 105 may also include a mobile data network that may include 3G, 4G, LTE, LTE-V2X, LTE-D2D, VoLTE or any other mobile data network or combination of mobile data networks. Further, the network 105 may include one or more IEEE 802.11 wireless networks.

In some embodiments, the network 105 is a V2X network. For example, the network 105 must include a vehicle, such as the ego vehicle 123, as an originating endpoint for each wireless communication transmitted by the network 105. An originating endpoint is the endpoint that initiated a wireless communication using the network 105. In some embodiments, the network 105 is a vehicular network.

In some embodiments, one or more of the ego vehicle 123 and the remote vehicle 124 are DSRC-equipped vehicles. For example, the ego vehicle 123 and the remote vehicle 124 each include a standard-compliant GPS unit 150 and a DSRC radio (e.g., the omnidirectional radio 143 is a DSRC radio in embodiments where the ego vehicle 123 is a DSRC-equipped vehicle). The network 105 may include a DSRC communication channel shared among the ego vehicle 123 and the remote vehicle 124.

The ego vehicle 123 may include a car, a truck, a sports utility vehicle, a bus, a semi-truck, a drone, or any other roadway-based conveyance. In some embodiments, the ego vehicle 123 may include an autonomous vehicle or a semi-autonomous vehicle. Although not depicted in FIG. 1, in some embodiments, the ego vehicle 123 includes an autonomous driving system. The autonomous driving system includes code and routines that provides sufficient autonomous driving features to the ego vehicle 123 to render the ego vehicle 123 an autonomous vehicle or a highly autonomous vehicle. In some embodiments, the ego vehicle 123 is a Level III autonomous vehicle or higher as defined by the National Highway Traffic Safety Administration and the Society of Automotive Engineers.

The ego vehicle 123 is a connected vehicle. For example, the ego vehicle 123 is communicatively coupled to the network 105 and operable to send and receive messages via the network 105. The remote vehicle 124 is also a connected vehicle.

The ego vehicle 123 includes one or more of the following elements: a processor 125; a sensor set 126; a standard-compliant GPS unit 150; a communication unit 145; an onboard unit 139; a memory 127; and a switching system 199. These elements may be communicatively coupled to one another via a bus 121.

The processor 125 includes an arithmetic logic unit, a microprocessor, a general-purpose controller, or some other processor array to perform computations and provide electronic display signals to a display device. The processor 125 processes data signals and may include various computing architectures including a complex instruction set computer (CISC) architecture, a reduced instruction set computer (RISC) architecture, or an architecture implementing a combination of instruction sets. Although FIG. 1 depicts a single processor 125 present in the ego vehicle 123, multiple processors may be included in the ego vehicle 123. The processor 125 may include a graphical processing unit. Other processors, operating systems, sensors, displays, and physical configurations may be possible.

In some embodiments, the processor 125 may be an element of a processor-based computing device of the ego vehicle 123. For example, the ego vehicle 123 may include one or more of the following processor-based computing devices and the processor 125 may be an element of one of these devices: an onboard vehicle computer; an electronic control unit; a navigation system; an advanced driver assistance system ("ADAS system") and a head unit. In some embodiments, the processor 125 is an element of the onboard unit 139.

The onboard unit 139 is a special purpose processor-based computing device. In some embodiments, the onboard unit 139 is a communication device that includes one or more of the following elements: the communication unit 145; the processor 125; the memory 127; and the switching system 199. In some embodiments, the onboard unit 139 is the computer system 200 depicted in FIG. 2. In some embodiments, the onboard unit 139 is an electronic control unit (ECU).

The sensor set 126 includes one or more onboard sensors. The sensor set 126 may record sensor measurements that describe the ego vehicle 123 or the physical environment that includes the ego vehicle 123. The sensor data includes digital data that describes the sensor measurements.

In some embodiments, the sensor set 126 may include one or more sensors that are operable to measure the physical environment outside of the ego vehicle 123. For example, the sensor set 126 may include cameras, lidar, radar, sonar and other sensors that record one or more physical characteristics of the physical environment that is proximate to the ego vehicle 123.

In some embodiments, the sensor set 126 may include one or more sensors that are operable to measure the physical environment inside a cabin of the ego vehicle 123. For example, the sensor set 126 may record an eye gaze of the driver (e.g., using an internal camera), where the driver's hands are located (e.g., using an internal camera) and whether the driver is touching a head unit or infotainment system with their hands (e.g., using a feedback loop from the head unit or infotainment system that indicates whether the buttons, knobs or screen of these devices is being engaged by the driver).

In some embodiments, the sensor set 126 may include one or more of the following sensors: an altimeter; a gyroscope; a proximity sensor; a microphone; a microphone array; an accelerometer; a camera (internal or external); a LIDAR sensor; a laser altimeter; a navigation sensor (e.g., a global positioning system sensor of the standard-compliant GPS unit 150); an infrared detector; a motion detector; a thermostat; a sound detector, a carbon monoxide sensor; a carbon dioxide sensor; an oxygen sensor; a mass air flow sensor; an engine coolant temperature sensor; a throttle position sensor; a crank shaft position sensor; an automobile engine sensor; a valve timer; an air-fuel ratio meter; a blind spot meter; a curb feeler; a defect detector; a Hall effect sensor, a manifold absolute pressure sensor; a parking sensor; a radar gun; a speedometer; a speed sensor; a tire-pressure monitoring sensor; a torque sensor; a transmission fluid temperature sensor; a turbine speed sensor (TSS); a variable reluctance sensor; a vehicle speed sensor (VSS); a water sensor; a wheel speed sensor; and any other type of automotive sensor.

In some embodiments, the sensor set 126 includes a network sniffer that is operable to record, among other things, the latency of a wireless network such as the network 105. In some embodiments, the network sniffer is operable to predict a latency for using offboard computing resources of the edge server 104 and/or the cloud server 106. In some embodiments, the network sniffer is operable to predict a latency for using the onboard resources of the ego vehicle 123. In some embodiments, the network sniffer is operable to record an actual latency which results from a switching decision. In some embodiments, the network sniffer is operable to output a description of whether the outcome from the switching decision was successful.

In some embodiments, the switching system 199 includes code and routes that are operable, when executed by the processor 125, to cause the processor 125 to execute steps that are consistent with achieving one or more of the following: determining a predicted latency for using offboard computing resources of the edge server 104; determining a predicted latency for using offboard computing resources of the cloud server 106; determining a predicted latency for using the onboard resources of the ego vehicle 123; determining an actual latency which results from a switching decision; and generating a description of whether the outcome from the switching decision was successful.

In some embodiments, a successfulness of a switching decision is determined by the switching system 199 by determining whether the switching decision resulted in a lower latency relative to the alternative decision. For example, if the switching decision is to use offboard resources, whether the actual latency measured by the sensor set 126 is less than the predicted latency for using the onboard resources of the ego vehicle 123.

In some embodiments, a successfulness of a switching decision is determined by the switching system 199 by determining whether the switching decision resulted in a more accurate calculation by the edge server 104 than would have been achieved by the onboard unit 139 of the ego vehicle 123. For example, if the switching decision is to use offboard resources, whether one or more of the following are true: the processor of the edge server 104 is faster than the processor 125 of the ego vehicle 123; the sensor data of the edge server is more accurate than the ego sensor data 193; the bandwidth of the edge server 104 is greater than the bandwidth of the communication unit 145 of the ego vehicle 123; the V2X communications of the edge server 104 are faster than the V2X communications of the ego vehicle 123; and the V2X communications of the edge server 104 are more successfully completed than the V2X communications of the ego vehicle 123.

The sensor set 126 is operable to record sensor data that describes the measurements recorded by one or more of the sensors of the sensor set 126. For example, the sensor set 126 of the ego vehicle 123 is operable to record the ego sensor data 193 and the sensor set 126 of the remote vehicle 124 is operable to record the remote sensor data 194. The ego sensor data 193 includes digital data describing the sensor measurements of the sensor set 126 of the ego vehicle 123 from the perspective of the sensor set 126 of the ego vehicle 123. The remote sensor data 194 includes digital data describing the sensor measurements of the sensor set 126 of the remote vehicle 124 from the perspective of the sensor set 126 of the remote vehicle 124.

In some embodiments, the ego sensor data 193 includes digital data that describes, among other things, one or more of the following: the environment at a time that a switching decision is made; whether onboard resources or offboard resources (i.e., the resources of the edge server 104) where used as the result of the switching decision; for offboard usage, latency information describing the latency of using offboard resources; whether a wireless communication is received by the desired endpoint as a result of the switching decision; and any other sensor measurement that is relevant to assessing the quality or outcome of the switching decision.

In some embodiments, the edge server 104 transmits digital data to the ego vehicle 123 informing the switching system 199 about one or more of the following, or giving the switching system 199 of the ego vehicle 123 sufficient information to determine one or more of the following: whether the processor of the edge server 104 is faster than the processor 125 of the ego vehicle 123; whether the sensor data of the edge server is more accurate than the ego sensor data 193; whether the bandwidth of the edge server 104 is greater than the bandwidth of the communication unit 145 of the ego vehicle 123; whether the V2X communications of the edge server 104 are faster than the V2X communications of the ego vehicle 123; and whether the V2X communications of the edge server 104 are more successfully completed than the V2X communications of the ego vehicle 123. This digital data may be stored in the ego sensor data 193 or some other digital data stored by the memory 127.

In some embodiments, the remote sensor data 194 describes similar information as the ego sensor data 193 although from the perspective of the remote vehicle 124.

In some embodiments, the switching system 199 of the ego vehicle 123 causes the communication unit 145 of the ego vehicle 123 to transmit the ego sensor data 193 to one or more of the edge server 104, the cloud server 106, and the remote vehicle 124 via the network 105. In some embodiments, the switching system 199 of the remote vehicle 124 causes the communication unit 145 of the remote vehicle 124 to transmit the remote sensor data 194 to one or more of the edge server 104, ego vehicle 123, and cloud server 106 via the network 105.

Accordingly, in some embodiments the edge server 104 includes a non-transitory memory that stores the remote sensor data 194 and the ego sensor data 193. The edge server 104 also includes a non-transitory memory that stores the lookup table 182 and an instance of the decision data 183 described herein. In some embodiments, the decision data 183 of the edge server 104 describes a switching decision made by the switching system 199 of the edge server 104 that may or may not provide consensus for a switching decision made by the switching system 199 of the ego vehicle 123 in some embodiments. In some embodiments, the edge server 104 provides a V2X message to the ego vehicle 123 that includes decision data 183 informing the ego vehicle 123 about the switching decision of the edge server 104 so that the switching system 199 of the ego vehicle 123 can determine whether there is a consensus.

In some embodiments, the sensors of the sensor set 126 are operable to collect sensor data. The sensors of the sensor set 126 include any sensors that are necessary to measure and record the sensor measurements that are necessary for the switching system 199 to provide its functionality.

In some embodiments, the sensor data includes any measurements that are necessary to generate, measure, infer or otherwise determine some or all of the digital data stored in the memory 127 as depicted in FIG. 1.

As described above, in some embodiments the sensor set 126 is operable to record any sensor measurements that are necessary to generate the context data 186. The context data 186 includes digital data that describes the context of a switching decision or the context in which a switching decision is made by the switching system 199.

For example, in some embodiments, the context data 186 includes digital data that describes one or more of the following: the context of the resource usage (e.g., emergency, non-emergency, other information that describes the context of the usage, etc.); how many vehicles are on a roadway that includes the ego vehicle 123 at the time of a switching decision; an amount of network traffic measured on the network 105 at the time of the switching decision or just before the switching decision is made; a predicted latency for using offboard computing resources of the edge server 104 or the cloud server 106; a predicted latency for using the onboard resources of the ego vehicle 123; an actual latency measured by the sensor set 126 as a result of the switching decision; a description of whether the outcome from the switching decision was successful (i.e., whether the switching decision resulted in a lower latency relative to the alternative decision—for example, if the switching decision is to use offboard resources, whether the actual latency measured by the sensor set 126 is less than the predicted latency for using the onboard resources of the ego vehicle 123); etc.

In some embodiments, the context data 186 is a combination of the sensor measurements and the context information described above.

In some embodiments, the context data 186 describes various types of context which affect the switching decision of the ego vehicle. For example, the context data 186 describes one or more of the following: (1) a roadway context of the roadway on which the ego vehicle 123 travels (e.g.: weather conditions; whether the roadway is dry, icy, or wet; the lighting conditions; whether the roadway is crowded; how many vehicles are traveling in some or all of the lanes of the roadway, etc.); (2) a driving context of the ego vehicle 123 (e.g., emergency situation, non-emergency situation, uncertain about the emergency status of the situation, vehicle speed, vehicle acceleration, vehicle deceleration, roadway type, (e.g., highway, interstate, rural road, feeder, etc.), which lane the vehicle is traveling in, whether the vehicle is traveling in an exit lane, on an off-ramp, on an on-ramp, a presence or absence of roadway construction, a presence or absence of pedestrians on a roadway, a presence or absence of emergency workers or police officer on a roadway, a presence or absence of a collision scene on a roadway, etc.), and (3) a network context of the network 105 (e.g.: whether the network 105 is congested; which channels of the V2X radio 144 are congested; the latency of the network 105; the latency of some or all of the channels of the V2X radio 144; how many other remote vehicles 124 are attempting to transmit V2X messages via the network 105; for some or all of the channels of the V2X radio 144, how many other remote vehicles 124 are attempting to transmit V2X messages via the network 105, etc.). The contexts described herein are examples and not intended to be limiting; the context data 186 may describe any context which affects the switching decision.

The term "vehicular context" as used herein refers to the roadway contexts and driving contexts described above.

In some embodiments, the switching system 199 includes code and routines that are operable to generate the historical data 187 and lookup table 182 that include entries that correspond to the contexts described by the context data 186 so that these data and data structures are searchable by the switching system 199 based on queries that include context data 186 or new context data 189 describing a current context of a switching decision which the switching system 199 is making or about to make.

In some embodiments, the contexts described by the context data 186 and the new context data 189 are a subset of the measurements recorded by the sensor set 126 of the ego vehicle 123 and described by the ego sensor data 193. In some embodiments, the context data 186 describes any context which is explicit, implicit, inferable, or calculable based on the sensor measurements that are recordable by some or all of the sensors included in the sensor set 126.

In some embodiments, the switching system 199 includes codes and routines that are operable to analyze the ego sensor data 193 and generate the context data 186 and the new context data 189 based on analysis of the ego sensor data 193. For example, the switching system 199 is executed by the processor 125 and the switching system 199 causes the processor 125 to analyze the ego sensor data 193 and determine one or more of the following based on the analysis of the ego sensor data 193: one or more vehicular contexts; and one or more network contexts.

In some embodiments, a vehicular context is a context that describes information about the roadway on which the ego vehicle 123 travels. In some embodiments, a vehicular context is a context that describes information about the driving condition of the ego vehicle 123, a safety of the ego vehicle 123 (e.g., whether a collision or near collision is imminent or possibly imminent, or any other factor which affects the safety of the ego vehicle 123, the driver, or some other entity on the roadway).

In some embodiments, a network context is a context that describes information about the network 105 or one or more channels of the network 105.

Examples of vehicular contexts and network contexts are included in the description of the context data 186 provided above.

The determination module 197 is depicted as stored in the memory 127. In some embodiments, the determination module is an element of the switching system 199. In some embodiments, the switching system 199 is stored on the memory 127.

In some embodiments, the determination module 197 includes code and routines that are operable, when executed by the processor 125, to execute one or more steps of the example general method described above. In some embodiments, the determination module 197 includes code and routines that are operable, when executed by the processor 125, to execute one or more steps of the method 300 depicted in FIG. 3. In some embodiments, the determination module 197 includes code and routines that are operable, when executed by the processor 125, to execute one or more steps of the method described by the claims as originally filed. In some embodiments, the determination module 197 includes code and routines that are operable to analyze the payloads received from the edge server and/or the cloud server to determine if there is a consensus among the switching decisions of these endpoints and the ego vehicle.

In some embodiments, the standard-compliant GPS unit 150 includes any hardware and software necessary to make the ego vehicle 123 or the standard-compliant GPS unit 150 compliant with one or more of the following DSRC standards, including any derivative or fork thereof: EN 12253: 2004 Dedicated Short-Range Communication—Physical layer using microwave at 5.8 GHz (review); EN 12795:2002 Dedicated Short-Range Communication (DSRC)—DSRC Data link layer: Medium Access and Logical Link Control (review); EN 12834:2002 Dedicated Short-Range Communication—Application layer (review); and EN 13372:2004 Dedicated Short-Range Communication (DSRC)—DSRC profiles for RTTT applications (review); EN ISO 14906: 2004 Electronic Fee Collection—Application interface.

In some embodiments, the standard-compliant GPS unit 150 is operable to provide position data describing the location of the ego vehicle 123 with lane-level accuracy. For example, the ego vehicle 123 is traveling in a lane of a multi-lane roadway. Lane-level accuracy means that the lane of the ego vehicle 123 is described by the position data so accurately that a precise lane of travel of the ego vehicle 123 may be accurately determined based on the position data for this vehicle 123 as provided by the standard-compliant GPS unit 150.

In some embodiments, the standard-compliant GPS unit 150 includes hardware that wirelessly communicates with a GPS satellite (or GPS server) to retrieve position data that describes the geographic location of the ego vehicle 123 with a precision that is compliant with the DSRC standard. The DSRC standard requires that position data be precise enough to infer if two vehicles (one of which is, for example, the ego vehicle 123) are located in adjacent lanes of travel on a roadway. In some embodiments, the standard-compliant GPS unit 150 is operable to identify, monitor and track its two-dimensional position within 1.5 meters of its actual position 68% of the time under an open sky. Since roadway lanes are typically no less than 3 meters wide, whenever the two-dimensional error of the position data is less than 1.5 meters the switching system 199 described herein may analyze the position data provided by the standard-compliant GPS unit 150 and determine what lane the ego vehicle 123 is traveling in based on the relative positions of two or more different vehicles (one of which is, for example, the ego vehicle 123) traveling on a roadway at the same time.

By comparison to the standard-compliant GPS unit 150, a conventional GPS unit which is not compliant with the DSRC standard is unable to determine the location of the ego vehicle 123 with lane-level accuracy.

The communication unit 145 transmits and receives data to and from a network 105 or to another communication channel. In some embodiments, the communication unit 145 may include a DSRC transmitter, a DSRC receiver and other hardware or software necessary to make the ego vehicle 123 a DSRC-equipped device.

In some embodiments, the communication unit 145 includes a port for direct physical connection to the network 105 or to another communication channel. For example, the communication unit 145 includes a USB, SD, CAT-5, or similar port for wired communication with the network 105. In some embodiments, the communication unit 145 includes a wireless transceiver for exchanging data with the network 105 or other communication channels using one or more wireless communication methods, including: IEEE 802.11; IEEE 802.16, BLUETOOTH®; EN ISO 14906:2004 Electronic Fee Collection—Application interface EN 11253: 2004 Dedicated Short-Range Communication—Physical layer using microwave at 5.8 GHz (review); EN 12795:2002 Dedicated Short-Range Communication (DSRC)—DSRC Data link layer: Medium Access and Logical Link Control (review); EN 12834:2002 Dedicated Short-Range Communication—Application layer (review); EN 13372:2004 Dedicated Short-Range Communication (DSRC)—DSRC profiles for RTTT applications (review); the communication method described in U.S. patent application Ser. No. 14/471, 387 filed on Aug. 28, 2014 and entitled "Full-Duplex Coordination System"; or another suitable wireless communication method.

In some embodiments, the communication unit 145 includes a full-duplex coordination system as described in U.S. patent application Ser. No. 14/471,387 filed on Aug. 28, 2014 and entitled "Full-Duplex Coordination System," the entirety of which is incorporated herein by reference.

In some embodiments, the communication unit 145 includes a cellular communications transceiver for sending and receiving data over a cellular communications network including via short messaging service (SMS), multimedia messaging service (MMS), hypertext transfer protocol (HTTP), direct data connection, WAP, e-mail, or another suitable type of electronic communication. In some embodiments, the communication unit 145 includes a wired port and a wireless transceiver. The communication unit 145 also provides other conventional connections to the network 105 for distribution of files or media objects using standard network protocols including TCP/IP, HTTP, HTTPS, and SMTP, millimeter wave, DSRC, etc.

In some embodiments, the communication unit 145 includes a V2X radio 144. In some embodiments, the V2X radio 144 is a hardware unit that includes one or more transmitters and one or more receivers that is operable to send and receive any type of wireless omnidirectional communication that includes a vehicle such as the ego vehicle 123 as a transmitter or receiver of the omnidirectional communication.

In some embodiments, the V2X radio 144 includes a DSRC transmitter and a DSRC receiver. The DSRC transmitter is operable to transmit and broadcast DSRC messages over the 5.9 GHz band. The DSRC receiver is operable to receive DSRC messages over the 5.9 GHz band. In some embodiments, the DSRC transmitter and the DSRC receiver operate on some other band which is reserved exclusively for DSRC.

In some embodiments, the V2X radio 144 periodically broadcasts a Basic Safety Message ("BSM message" if singular, or "BSM messages" if plural) as described by the DSRC standard or some similar, derivative, replacement, or competing standard. In some embodiments, the communication unit 145 includes a non-transitory memory which stores digital data that controls the frequency for broadcasting BSM messages. In some embodiments, the non-transitory memory stores a buffered version of the ego sensor data 193 for the ego vehicle 123 so that the ego sensor data 193 for the ego vehicle 123 is broadcast as an element of the BSM messages which are regularly broadcast by the V2X radio 144 (e.g., at an interval of once every 0.10 seconds). An example of the digital data that is included in a BSM message includes some or all of the digital data depicted in FIG. 1 as being stored by the memory 127 of the ego vehicle 123.

In some embodiments, the V2X radio 144 includes any hardware or software which is necessary to make the ego vehicle 123 compliant with the DSRC standards. In some embodiments, the standard-compliant GPS unit 150 is an element of the V2X radio 144.

The memory 127 is a non-transitory storage medium. The memory 127 stores instructions or data that may be executed by the processor 125. The instructions or data include code for performing the techniques described herein.

Referring back to FIG. 1, in some embodiments the memory 127 is one or more of a dynamic random-access memory (DRAM) device, a static random-access memory (SRAM) device, flash memory, or some other memory device. In some embodiments, the memory 127 includes a non-volatile memory or similar permanent storage device and media including a hard disk drive, a floppy disk drive, a CD-ROM device, a DVD-ROM device, a DVD-RAM device, a DVD-RW device, a flash memory device, or some other mass storage device for storing information on a more permanent basis.

In some embodiments, the memory 127 stores any or all of the digital data or information described herein.

As depicted in FIG. 1, the memory 127 stores the following digital data: the ego sensor data 193; the simulation data 181; the digital twin data 184; the context data 186; the historical data 187, the lookup table 182; the decision data 183; the updated lookup table 182; the new ego sensor data 188; the new historical data 170; the new digital twin data 171; and the new context data 189. As depicted in FIG. 1, the memory 127 stores the following codes and routines: the simulation software 198; and the determination module 197.

In some embodiments, the memory 127 also stores sensor data and any digital data that is returned from the lookup table 182 (or the updated lookup table 182) responsive to a query or received from an endpoint of the network 105 via a V2X message.

In some embodiments, the switching system 199 includes code and routines that are operable, when executed by the processor 125, to cause the processor 125 to: execute or activate one or more sensors of the sensor set 126 to cause to record the sensor measurements that are described by the ego sensor data 193; and store these sensor measurements as the ego sensor data 193 in the memory 127.

In some embodiments, the memory 127 also stores message data. Message data is digital data that describes the payload for a wireless message (e.g., a directional communication and/or an omnidirectional communication) transmitted or received by the ego vehicle 123.

The digital data stored by the memory 127 is described above with reference to the example general method, and so, those descriptions will not be repeated here.

In some embodiments, the switching system 199 includes code and routines that are operable, when executed by the processor 125, to execute one or more steps of the example general method described above. In some embodiments, the switching system 199 includes code and routines that are operable, when executed by the processor 125, to execute one or more steps of the method depicted in FIG. 3. In some embodiments, the switching system 199 includes code and routines that are operable to execute one or more steps of the claims as originally filed.

In some embodiments, the switching system 199 is an element of the communication unit 145. In some embodiments, the switching system is not an element of the communication unit 145. In some embodiments, the switching system 199 is stored on the memory 127. In some embodiments, the switching system 199 is an element of the onboard unit 139 or some other onboard vehicle computer (see, e.g., FIG. 2). In some embodiments, the switching system 199 includes a processor 125 and the memory 127.

In some embodiments, the switching system 199 is implemented using hardware including a field-programmable gate array ("FPGA") or an application-specific integrated circuit ("ASIC"). In some other embodiments, the switching system 199 is implemented using a combination of hardware and software.

The remote vehicle 124 includes elements and functionality which are similar to those described above for the ego vehicle 123, and so, those descriptions will not be repeated here. In some embodiments, the ego vehicle 123, roadside device 103, and the remote vehicle 124 are located in a same geographic region.

In some embodiments, the wireless messages described herein may be encrypted themselves or transmitted via an encrypted communication provided by the network 105. In some embodiments, the network 105 may include an encrypted virtual private network tunnel ("VPN tunnel") that does not include any infrastructure components such as network towers, hardware servers or server farms. In some embodiments, the switching system 199 includes encryption keys for encrypting wireless messages and decrypting the wireless messages described herein.

The remote vehicle 124 includes elements that are similar to the ego vehicle 123, and so, those descriptions will not be repeated here. The remote vehicle 124 includes a sensor set 126 that generates remote sensor data 194. The remote sensor data 194 includes digital data that describes the measurements recorded by the sensors of the sensor set 126. The remote sensor data 194 describes information that is similar to the information described by the ego sensor data 193, and so, those descriptions will not be repeated here. In some embodiments, the sensor set 126 of the remote vehicle 124 also records context data 186 which is similar to the context data 186 that is recorded by the sensor set 126 of the ego vehicle 123.

In some embodiments, the roadside device 103 is a connected roadside infrastructure device that includes an edge server 104 and is operable to send and receive wireless communications via the network 105. In some embodiments, the roadside device 103 is a device that: (1) includes a communication unit 145, an edge server 104, and a processor 125; and (2) is present in an environment (e.g., a roadway environment) with the ego vehicle 123 and/or the remote vehicle 124.

In some embodiments, the roadside device 103 includes the following elements: a memory 127; a bus 121; a processor 125; a communication unit 145; a sensor set 126; and a switching system 199. These elements of the roadside device 103 provide similar functionality as those described above for the ego vehicle 123, and so, these descriptions will not be repeated here.

In some embodiments, the roadside device 103 is not an element of the vehicular micro cloud.

In some embodiments, the switching decision includes determining whether to offload vehicle functions to the edge server 104 that is included in the roadside device so that the offboard resources of the edge server 104 are used to provide these vehicle functions instead of the onboard resources of the ego vehicle 123, or to handle these vehicle functions using the onboard resources of the ego vehicle 123. The edge server 104 is a hardware-based processor computing device that is configured to serve as a conventional edge server. For example, the edge server 104 is a mainframe, a laptop computer, a desktop computer, router, hardware security system device (e.g., a firewall device or some other security system), or some other hardware-based processor computing device.

The cloud server 106 is a hardware-based processor computing device that is configured to serve as a conventional cloud server 106. For example, the cloud server 106 is a mainframe, a laptop computer, a desktop computer, or some other hardware-based processor computing device. In some embodiments, the switching decision includes determining whether to offload vehicle functions to the cloud server 106 so that the offboard resources of the cloud server 106 are used to provide these vehicle functions instead of the onboard resources of the ego vehicle 123, or to handle these vehicle functions using the onboard resources of the ego vehicle 123.

In some embodiments, the switching system 199 of the edge server 104 and/or the cloud server 106 is operable to provide consensus (or not provide consensus) with the switching decision arrived at by the switching system 199 of the ego vehicle 123. In some embodiments, the switching system 199 of the ego vehicle 123 and the remote vehicle 124 are operable to cause their respective communication units 145 to transmit their sensor data (e.g., the ego sensor data 193 and the remote sensor data 194, respectively) to the edge server 104 and/or the cloud server 106 so that their switching systems 199 can provide their functionality of arriving at a switching decision and then transmitting a V2X message to the ego vehicle 123 including digital data describing their switching decision so that the switching system 199 of the ego vehicle 123 can determine whether or not there is a consensus among these switching decisions.

Figure 2:
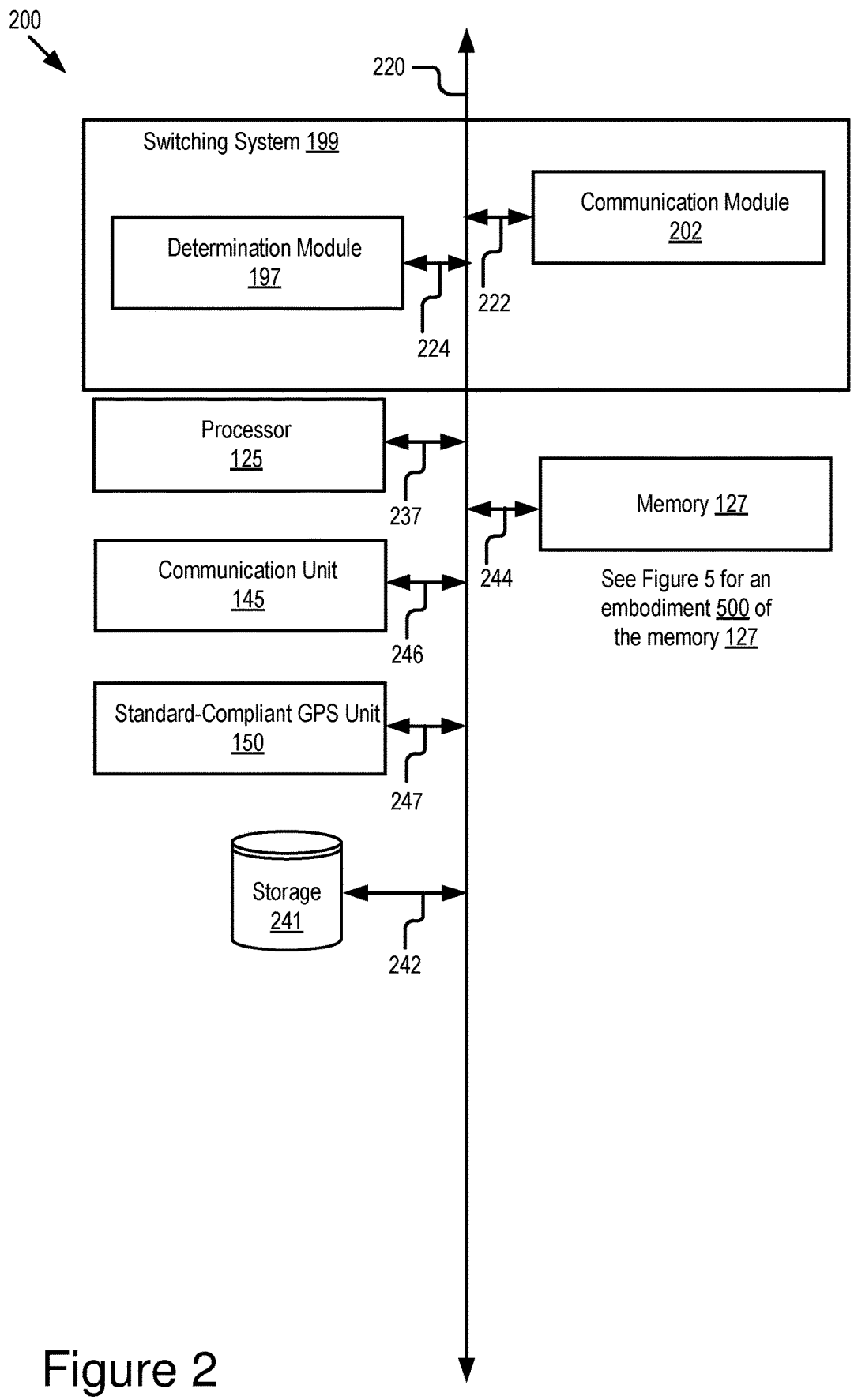
FIG. 2 is a block diagram illustrating an example computer system including a switching system according to some embodiments.

Referring now to FIG. 2, depicted is a block diagram illustrating an example computer system 200 including a switching system 199 according to some embodiments.

In some embodiments, the computer system 200 may include a special-purpose computer system that is programmed to perform one or more steps of one or more of the methods, protocols, and strategies described herein.

In some embodiments, the computer system 200 may include a processor-based computing device. For example, the computer system 200 may include an onboard vehicle computer system of the ego vehicle 123 or the remote vehicle 124.

The computer system 200 may include one or more of the following elements according to some examples: the switching system 199; a processor 125; a communication unit 145; a standard-compliant GPS unit 150; a storage 241; and a memory 127. The components of the computer system 200 are communicatively coupled by a bus 220.

In the illustrated embodiment, the processor 125 is communicatively coupled to the bus 220 via a signal line 237. The communication unit 145 is communicatively coupled to the bus 220 via a signal line 246. The standard-compliant GPS unit 150 is communicatively coupled to the bus 220 via a signal line 247. The storage 241 is communicatively coupled to the bus 220 via a signal line 242. The memory 127 is communicatively coupled to the bus 220 via a signal line 244.

The following elements of the computer system 200 were described above with reference to FIG. 1, and so, these descriptions will not be repeated here: the processor 125; the communication unit 145; the standard-compliant GPS unit 150; and the memory 127.

The storage 241 can be a non-transitory storage medium that stores data for providing the functionality described herein. The storage 241 may be a DRAM device, a SRAM device, flash memory, or some other memory devices. In some embodiments, the storage 241 also includes a non-volatile memory or similar permanent storage device and media including a hard disk drive, a floppy disk drive, a CD-ROM device, a DVD-ROM device, a DVD-RAM device, a DVD-RW device, a flash memory device, or some other mass storage device for storing information on a more permanent basis.

In some embodiments, the switching system 199 includes code and routines that are operable, when executed by the processor 125, to cause the processor 125 to execute one or more steps of one or more of the methods, protocols, and strategies described herein.

In the illustrated embodiment shown in FIG. 2, the switching system 199 includes a communication module 202 and the determination module 197.

The determination module 197 is communicatively coupled to the bus 220 via the signal line 224. In some embodiments, the determination module 197 includes code and routines that are operable, when executed by the processor 125, to execute steps that provide the functionality of the switching system 199. In some embodiments, the determination module 197 includes code and routines that are operable, when executed by the processor 125, to execute one or more steps of the example general method described above. In some embodiments, the determination module 197 includes code and routines that are operable, when executed by the processor 125, to execute one or more steps of the method 300 depicted in FIG. 3. In some embodiments, the determination module 197 includes code and routines that are operable, when executed by the processor 125, to execute one or more steps of the method described by the claims as originally filed. In some embodiments, the determination module 197 includes code and routines that are operable to analyze the payloads received from the edge server and/or the cloud server to determine if there is a consensus among the switching decisions of these endpoints and the ego vehicle.

The communication module 202 can be software including routines for handling communications between the switching system 199 and other components of the computer system 200. In some embodiments, the communication module 202 can be a set of instructions executable by the processor 125 to provide the functionality described below for handling communications between the switching system 199 and other components of the computer system 200. In some embodiments, the communication module 202 can be stored in the memory 127 of the computer system 200 and can be accessible and executable by the processor 125. The communication module 202 may be adapted for cooperation and communication with the processor 125 and other components of the computer system 200 via signal line 222.

The communication module 202 sends and receives data, via the communication unit 145, to and from one or more elements of the operating environment 100.

In some embodiments, the communication module 202 receives data from components of the switching system 199 and stores the data in one or more of the storage 241 and the memory 127.

In some embodiments, the communication module 202 may handle communications between components of the switching system 199 or the computer system 200.

Figure 3:
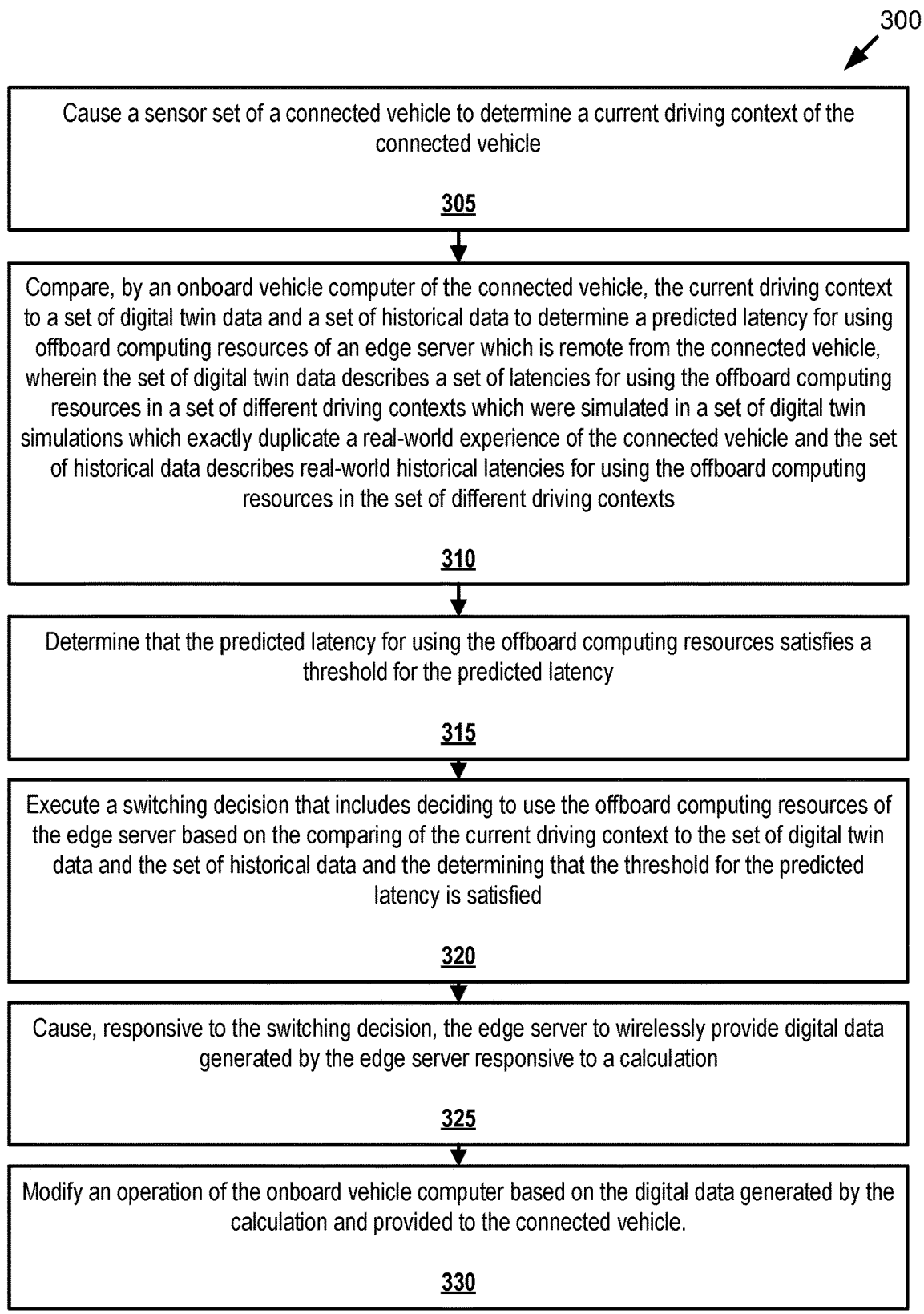
FIG. 3 includes a flowchart of an example method implemented by the switching system according to some embodiments.

Referring now to FIG. 3, depicted is an example method 300 implemented by the switching system according to some embodiments. The steps of the method 300 may be executed in any order, and not necessarily those depicted in FIG. 3. In some embodiments, one or more of the steps are skipped or modified in ways that are described herein or known or otherwise determinable by those having ordinary skill in the art. The method includes steps 305, 310, 315, 320, 325, and 330. In some embodiments, the method 300 is modified to include some or all of the steps described below with reference to the claims. In some embodiments, the method 300 is modified to include some or all aspects of the example general method described above.

Figure 4:
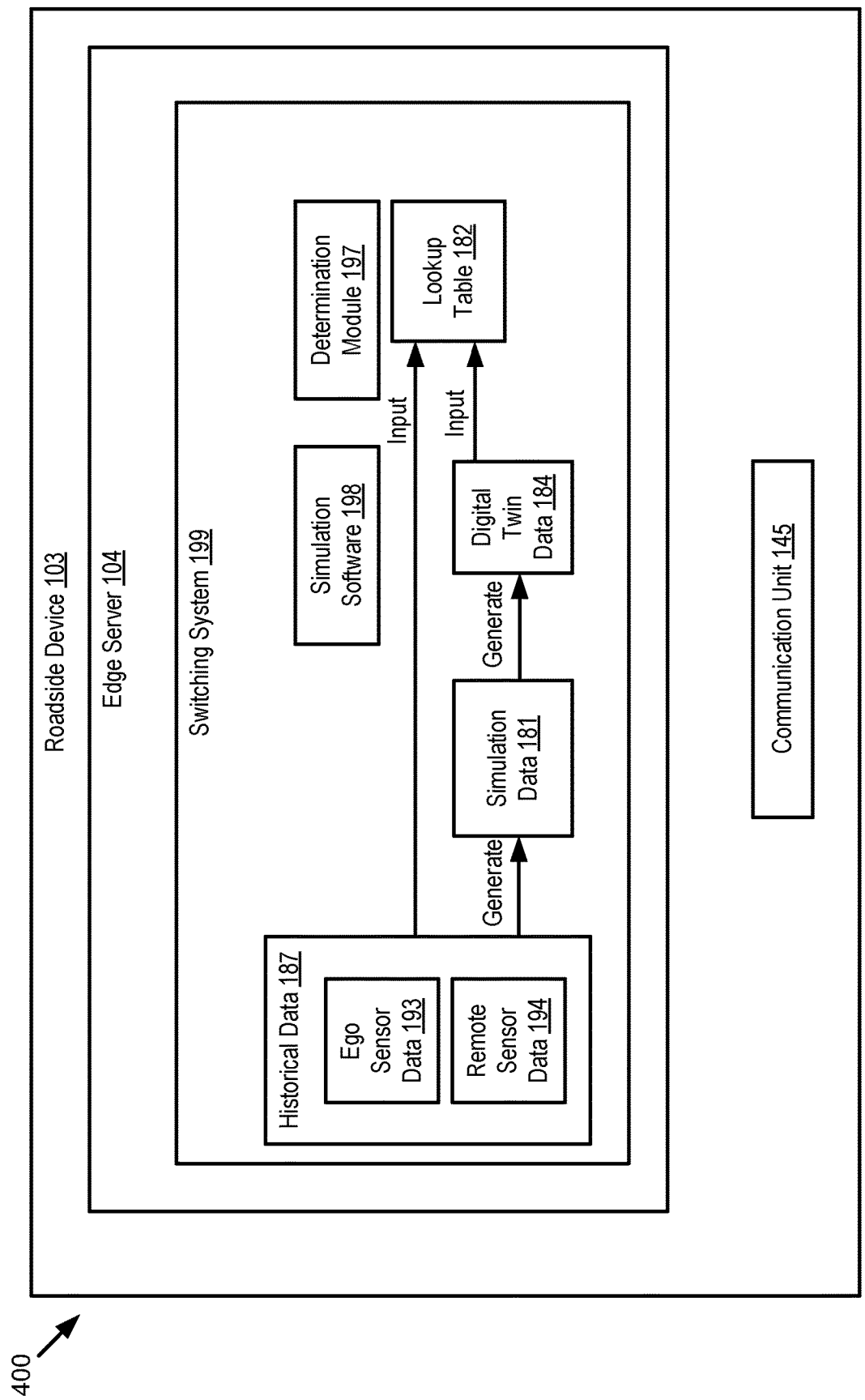
FIG. 4 is a block diagram illustrating a roadside device including an edge server and a switching system according to some embodiments.

Referring now to FIG. 4, depicted is a block diagram 400 of the roadside device 103 according to some embodiments. The roadside device 103 includes elements that are similar to those described above with reference to the ego vehicle and the roadside device of FIG. 1, and so, those descriptions will not be repeated here.

Figure 5:
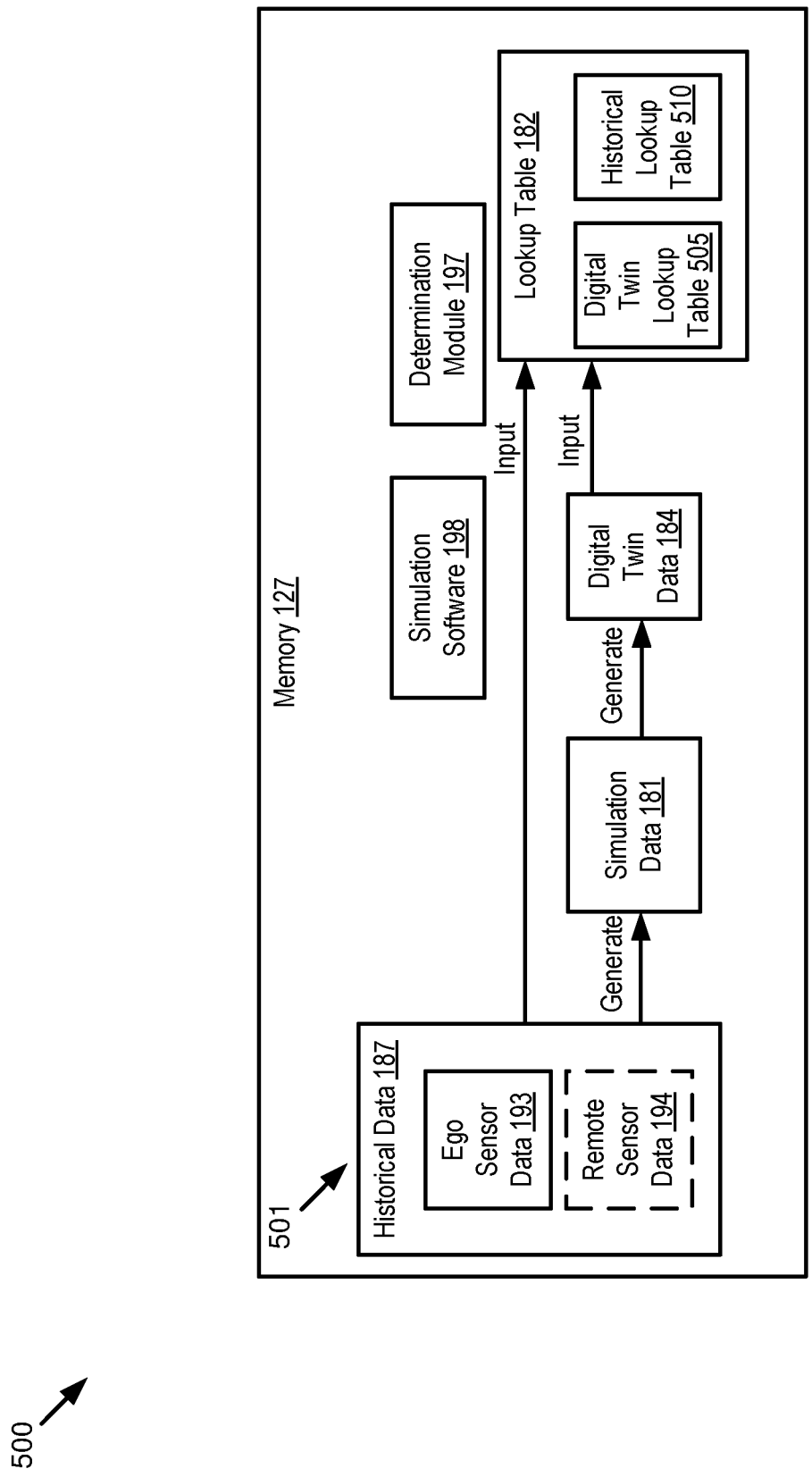
FIG. 5 is a block diagram illustrating a memory and a process for transforming digital data stored in the memory to build a digital twin lookup table and a historical lookup table according to some embodiments.

Referring now to FIG. 5, depicted is a block diagram 500 of the memory 127 according to some embodiments. Included in the block diagram 500 is a process 501 for transforming digital data stored in the memory to build a digital twin lookup table and a historical lookup table according to some embodiments.

In the above description, for purposes of explanation, numerous specific details are set forth in order to provide a thorough understanding of the specification. It will be apparent, however, to one skilled in the art that the disclosure can be practiced without these specific details. In some instances, structures and devices are shown in block diagram form in order to avoid obscuring the description. For example, the present embodiments can be described above primarily with reference to user interfaces and particular hardware. However, the present embodiments can apply to any type of computer system that can receive data and commands, and any peripheral devices providing services.

Reference in the specification to "some embodiments" or "some instances" means that a particular feature, structure, or characteristic described in connection with the embodiments or instances can be included in at least one embodiment of the description. The appearances of the phrase "in some embodiments" in various places in the specification are not necessarily all referring to the same embodiments.

Some portions of the detailed descriptions that follow are presented in terms of algorithms and symbolic representations of operations on data bits within a computer memory. These algorithmic descriptions and representations are the means used by those skilled in the data processing arts to convey the substance of their work most effectively to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms including "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present embodiments of the specification can also relate to an apparatus for performing the operations herein. This apparatus may be specially constructed for the required purposes, or it may include a general-purpose computer selectively activated or reconfigured by a computer program stored in the computer. Such a computer program may be stored in a computer-readable storage medium, including, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory, or any type of media suitable for storing electronic instructions, each coupled to a computer system bus.

The specification can take the form of some entirely hardware embodiments, some entirely software embodiments or some embodiments containing both hardware and software elements. In some preferred embodiments, the specification is implemented in software, which includes, but is not limited to, firmware, resident software, microcode, etc.

Furthermore, the description can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A data processing system suitable for storing or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including, but not limited, to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem, and Ethernet cards are just a few of the currently available types of network adapters.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the specification is not described with reference to any particular programming language. It will be appreciated that a variety of programming languages may be used to implement the teachings of the specification as described herein.

The foregoing description of the embodiments of the specification has been presented for the purposes of illustration and description. It is not intended to be exhaustive or to limit the specification to the precise form disclosed. Many modifications and variations are possible in light of the above teaching. It is intended that the scope of the disclosure be limited not by this detailed description, but rather by the claims of this application. As will be understood by those familiar with the art, the specification may be embodied in other specific forms without departing from the spirit or essential characteristics thereof. Likewise, the particular naming and division of the modules, routines, features, attributes, methodologies, and other aspects are not mandatory or significant, and the mechanisms that implement the specification or its features may have different names, divisions, or formats. Furthermore, as will be apparent to one of ordinary skill in the relevant art, the modules, routines, features, attributes, methodologies, and other aspects of the disclosure can be implemented as software, hardware, firmware, or any combination of the three. Also, wherever a component, an example of which is a module, of the specification is implemented as software, the component can be implemented as a standalone program, as part of a larger program, as a plurality of separate programs, as a statically or dynamically linked library, as a kernel-loadable module, as a device driver, or in every and any other way known now or in the future to those of ordinary skill in the art of computer programming. Additionally, the disclosure is in no way limited to embodiment in any specific programming language, or for any specific operating system or environment. Accordingly, the disclosure is intended to be illustrative, but not limiting, of the scope of the specification, which is set forth in the following claims.

What is claimed is:

1. A method comprising:
   determining, based on sensor data, a current driving context of a connected vehicle;
   comparing, by an onboard vehicle computer of the connected vehicle, the current driving context to a set of digital twin data and a set of historical data,
   wherein the set of digital twin data describes a set of latencies for using an offboard computing resource in a set of different driving contexts which were simulated in a set of digital twin simulations which substantially recreate a real-world experience of the connected vehicle; and
   wherein the set of historical data describes real-world historical latencies for using the offboard computing resource in the set of different driving contexts;
   determining, based on the comparing of the current driving context to the set of digital twin data and the set of historical data, a predicted latency of using the offboard resource of a remote computing device;
   determining that the predicted latency of using the offboard computing resource satisfies a threshold;
   executing a switching decision that includes deciding to use the offboard computing resource of the remote computing device;
   causing, the remote computing device to wirelessly provide the connected vehicle with digital data generated by the remote computing device; and modifying an operation of the onboard vehicle computer based on the digital data.

2. The method of claim 1, wherein the remote computing device executes a separate instance of the switching decision.

3. The method of claim 1, further comprising determining whether the switching decision improved the operation of the connected vehicle.

4. The method of claim 1, further comprising updating the set of digital twin data.

5. The method of claim 1, further comprising updating the set of historical data.

6. The method of claim 1, further comprising determining an actual latency resulting from the switching decision.

7. The method of claim 6, further comprising:
 determining whether the set of digital twin data or the set of historical data more accurately predicted the actual latency;
 determining a first weight to apply to the set of digital twin data in a future switching decision and a second weight to apply to the set of historical data in the future switching decision; and
 executing the future switching decision based on the set of digital twin data as modified by the first weight and the set of historical data as modified by the second weight.

8. The method of claim 1, wherein the digital data describes a sensor measurement recorded by a remote vehicle.

9. The method of claim 1, wherein the digital data describes an output of a computational process executed by the remote computing device for the connected vehicle.

10. A non-transitory computer program product installed in an onboard unit of a connected vehicle, the computer program product including codes and routines that are operable, when executed by the onboard unit, to cause the onboard unit to execute steps including:
 determining, based on sensor data, a current driving context of a connected vehicle;
 comparing the current driving context to a set of digital twin data and a set of historical data,
 wherein the set of digital twin data describes a set of latencies for using an offboard computing resource in a set of different driving contexts which were simulated in a set of digital twin simulations which substantially recreate a real-world experience of the connected vehicle; and
 wherein the set of historical data describes real-world historical latencies for using the offboard computing resource in the set of different driving contexts;
 determining, based on the comparing of the current driving context to the set of digital twin data and the set of historical data, a predicted latency of using the offboard resource of a remote computing device;
 determining that the predicted latency of using the offboard computing resource satisfies a threshold;
 executing a switching decision that includes deciding to use the offboard computing resource of the remote computing device;
 causing the remote computing device to wirelessly provide the connected vehicle with digital data generated by the remote computing device; and
 modifying an operation of the onboard unit based on the digital data.

11. The non-transitory computer program product of claim 10, wherein the remote computing device executes a separate instance of the switching decision.

12. The non-transitory computer program product of claim 10, wherein the computer program product includes additional codes and routines that are operable, when executed by the onboard unit, to cause the onboard unit to execute steps including determining whether the switching decision improved the operation of the connected vehicle.

13. The non-transitory computer program product of claim 10, wherein the computer program product includes additional codes and routines that are operable, when executed by the onboard unit, to cause the onboard unit to execute steps including updating the set of digital twin data.

14. The non-transitory computer program product of claim 10, wherein the computer program product includes additional codes and routines that are operable, when executed by the onboard unit, to cause the onboard unit to execute steps including updating the set of historical data.

15. The non-transitory computer program product of claim 10, wherein the computer program product includes additional codes and routines that are operable, when executed by the onboard unit, to cause the onboard unit to execute steps including determining an actual latency resulting from the switching decision.

16. The non-transitory computer program product of claim 15, wherein the computer program product includes additional codes and routines that are operable, when executed by the onboard unit, to cause the onboard unit to execute steps including:
 determining whether the set of digital twin data or the set of historical data more accurately predicted the actual latency;
 determining a first weight to apply to the set of digital twin data in a future switching decision and a second weight to apply to the set of historical data in the future switching decision; and
 executing the future switching decision based on the set of digital twin data as modified by the first weight and the set of historical data as modified by the second weight.

17. The non-transitory computer program product of claim 10, wherein the digital data describes a sensor measurement recorded by a remote vehicle.

18. The non-transitory computer program product of claim 10, wherein the digital data describes an output of a computational process executed by the remote computing device for the connected vehicle.

19. A system of a connected vehicle comprising:
 an onboard vehicle computer communicatively coupled to a non-transitory memory of the connected vehicle, wherein the onboard vehicle computer is operable to retrieve computer-executable code from the non-transitory memory which is operable, when executed by the onboard vehicle computer, to cause the onboard vehicle computer to:
  determine, based on sensor data, a current driving context of a connected vehicle;
  compare, by an onboard vehicle computer of the connected vehicle, the current driving context to a set of digital twin data and a set of historical data,
   wherein the set of digital twin data describes a set of latencies for using an offboard computing resource in a set of different driving contexts which were simulated in a set of digital twin simulations which substantially recreate a real-world experience of the connected vehicle; and
   wherein the set of historical data describes real-world historical latencies for using the offboard computing resource in the set of different driving contexts;

determine, based on the comparing of the current driving context to the set of digital twin data and the set of historical data, a predicted latency of using the offboard resource of a remote computing device;

determine that the predicted latency of using the offboard computing resource satisfies a threshold;

execute a switching decision that includes deciding to use the offboard computing resource of the remote computing device;

cause the remote computing device to wirelessly provide the connected vehicle with digital data generated by the remote computing device; and modify an operation of the onboard vehicle computer based on the digital data.

20. The system of claim 19, wherein the remote computing device executes a separate instance of the switching decision.

* * * * *